(12) United States Patent
Tanaka et al.

(10) Patent No.: US 8,568,183 B2
(45) Date of Patent: Oct. 29, 2013

(54) PROCESS OF PRODUCING ORGANIC ELECTROLUMINESCENCE ELEMENT COMPOSITION, ORGANIC ELECTROLUMINESCENCE ELEMENT COMPOSITION, PROCESS OF PRODUCING ORGANIC ELECTROLUMINESCENCE ELEMENT, ORGANIC ELECTROLUMINESCENCE ELEMENT, ORGANIC EL DISPLAY DEVICE AND ORGANIC EL LIGHTING

(71) Applicant: Mitsubishi Chemical Corporation, Chiyoda-ku (JP)

(72) Inventors: Futoshi Tanaka, Kanagawa (JP); Atsushi Takahashi, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 13/647,776

(22) Filed: Oct. 9, 2012

(65) Prior Publication Data
US 2013/0043784 A1 Feb. 21, 2013

Related U.S. Application Data

(63) Continuation of application No. PCT/JP2011/058851, filed on Apr. 7, 2011.

(30) Foreign Application Priority Data

Apr. 9, 2010 (JP) .................................. 2010-090459

(51) Int. Cl.
*H01J 9/00* (2006.01)
*C09K 11/06* (2006.01)

(52) U.S. Cl.
USPC ...................................... 445/24; 252/301.16

(58) Field of Classification Search
None
See application file for complete search history.

(56) References Cited

U.S. PATENT DOCUMENTS

| | | | |
|---|---|---|---|
| 2003/0116788 A1 | 6/2003 | Sakakibara et al. | |
| 2007/0075628 A1 | 4/2007 | Lewis et al. | |
| 2007/0077452 A1 | 4/2007 | Liu et al. | |
| 2007/0285002 A1 | 12/2007 | Ding et al. | |
| 2009/0066223 A1 | 3/2009 | Yabe et al. | |
| 2010/0230829 A1 | 9/2010 | Liu et al. | |

FOREIGN PATENT DOCUMENTS

| | | |
|---|---|---|
| JP | 7-114987 | 5/1995 |
| JP | 9-263754 | 10/1997 |
| JP | 11-3783 | 1/1999 |
| JP | 2002-359073 | 12/2002 |
| JP | 2003-221484 | 8/2003 |

(Continued)

OTHER PUBLICATIONS

International Search Report issued Jul. 12, 2011, in PCT/JP2011/058851 (with English-language translation).

*Primary Examiner* — Britt D Hanley
(74) *Attorney, Agent, or Firm* — Oblon, Spivak, McClelland, Maier & Neustadt, L.L.P.

(57) ABSTRACT

To provide a process of producing an organic electroluminescence element having a high current efficiency and a long drive life by a wet film formation process. The present invention relates to a process of producing an organic electroluminescence element composition, comprising a filtration step of filtering a solution containing an organic electroluminescence element material and a solvent, wherein the composition is obtained after a time-elapsing step wherein 8 hours or more elapses after the filtration step, and the composition is used for a wet film formation of an organic layer in an organic electroluminescence element.

11 Claims, 1 Drawing Sheet

(56) References Cited

FOREIGN PATENT DOCUMENTS

| | | |
|---|---|---|
| JP | 2003-292948 | 10/2003 |
| JP | 2003-347050 | 12/2003 |
| JP | 2004-41943 | 2/2004 |
| JP | 2004-127919 | 4/2004 |
| JP | 2005-19159 | 1/2005 |
| JP | 2005-340042 | 12/2005 |
| JP | 2006-5144 | 1/2006 |
| JP | 2008-506241 | 2/2008 |
| JP | 2009-278076 | 11/2009 |
| JP | 2009-283509 | 12/2009 |
| JP | 2010-505236 | 2/2010 |
| WO | WO 2006/095539 A1 | 9/2006 |

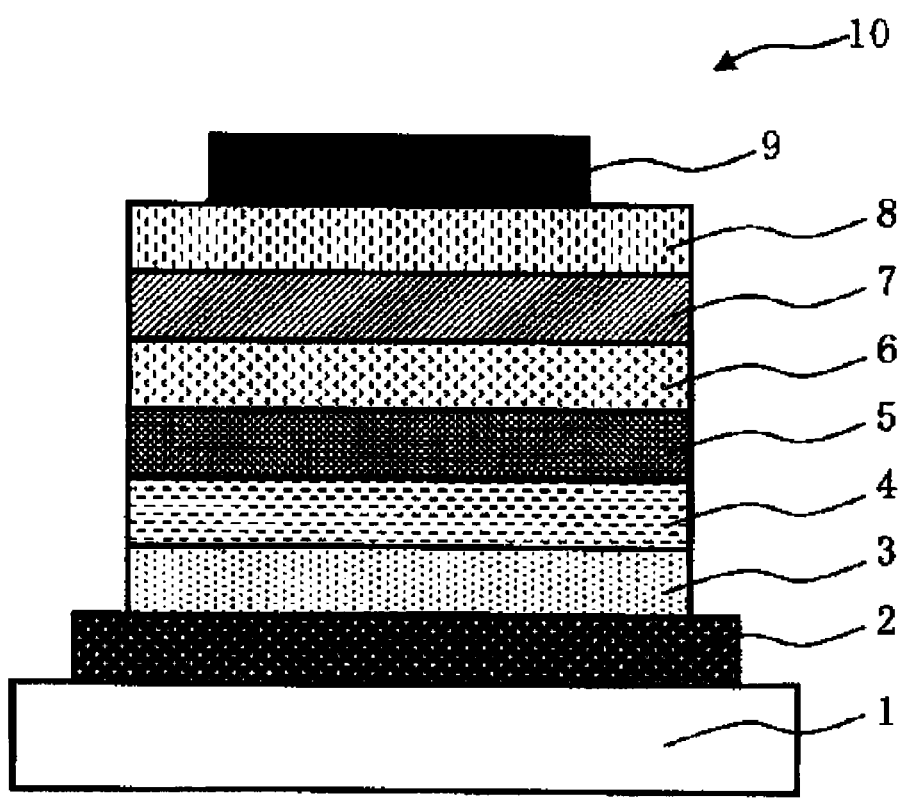

PROCESS OF PRODUCING ORGANIC ELECTROLUMINESCENCE ELEMENT COMPOSITION, ORGANIC ELECTROLUMINESCENCE ELEMENT COMPOSITION, PROCESS OF PRODUCING ORGANIC ELECTROLUMINESCENCE ELEMENT, ORGANIC ELECTROLUMINESCENCE ELEMENT, ORGANIC EL DISPLAY DEVICE AND ORGANIC EL LIGHTING

This application is a Continuation of International Application No. PCT/JP2011/058851, filed on Apr. 7, 2011.

TECHNICAL FIELD

The present invention relates to a process of producing an organic electroluminescence element composition; an organic electroluminescence element composition, produced by the production process; a process of producing an organic electroluminescence element; an organic electroluminescence element obtained by the producing process; and an organic EL display device and an organic EL lighting each containing the element.

BACKGROUND ART

Since the announcement of a laminated organic electroluminescence (hereinafter, sometimes simply referred to as "EL") element using a vapor deposition process by Kodak Corp., development of an organic EL display and an organic EL lighting is being aggressively made, and an organic EL display and an organic EL lighting are now used in practice.

In such a laminated organic electroluminescence element, plural organic layers (for example, a luminescent layer, a hole injection layer, a hole transport layer and an electron transport layer) are provided by stacking the layers between an anode and a cathode. In many cases, the organic layer is formed by vacuum depositing an organic layer material such as low molecular dye. However, it is difficult to obtain a homogeneous defectless thin film by a vacuum deposition process. Furthermore, since the vacuum deposition process requires a long time to form plural organic layers, a problem to be solved exists also in view of manufacturing efficiency of the element.

In this connection, a technique where plural organic layers of a laminated organic electroluminescence element are formed by a wet film formation method has been reported. For example, Patent Document 1 describes an organic electroluminescence element having a luminescent layer and a crosslinkable polymer-containing charge transport film obtained by coating a composition containing a compound having a crosslinking group and crosslinking the composition by light or heat. When a crosslinkable polymer-containing charge transport film is used, other layers can be easily formed on the charge transport film by a wet film formation method.

Such a process of manufacturing an organic electroluminescence element by a wet film formation method is expected to enable a simple, efficient and inexpensive manufacturing of a large-area organic EL device, and various studies are being made thereon. Also, in the process of manufacturing an organic electroluminescence element by a wet film formation method, the wet film formation can be performed by using an inkjet system, a nozzle coating system or the like as described in Patent Documents 2 and 3, and this is considered to enable the realization of a low-cost, large-area organic EL device.

In the process of manufacturing an organic electroluminescence element by a wet film formation method, materials for forming a layer having various functions are dissolved and dispersed in a solvent to produce an ink, and a coated film is formed by using the ink. However, in such an ink, precipitation, aggregation, crystallization and the like of the solute sometimes occur in the period until use.

Considering this, at the manufacture of an organic electroluminescence element including a wet film formation process, the ink is filtered immediately before the ink is used in practice (see, Patent Documents 4 to 8).

In this way, the manufacturing technology of an organic electroluminescence element by a wet film formation method is expected to be useful for realizing a simple, efficient and inexpensive process and forming a large-area element, and various developments have been conventionally made. As for the organic electroluminescence element manufactured by a wet film formation method, an element having a longer drive life and a higher current efficiency is demanded.

RELATED ARTS

Patent Documents

Patent Document 1: JP-A-7-114987 (the term "JP-A" as used herein means an "unexamined published Japanese patent application")
Patent Document 2: JP-A-2004-127919
Patent Document 3: JP-A-2004-41943
Patent Document 4: JP-A-11-3783
Patent Document 5: JP-A-9-263754
Patent Document 6: JP-A-2003-292948
Patent Document 7: JP-A-2005-19159
Patent Document 8: JP-A-2005-340042

OUTLINE OF THE INVENTION

Problems to be Solved by the Invention

An object of the present invention is to produce an organic electroluminescence element having a long drive life and a high current efficiency by a wet film formation method.

Means for Solving the Problems

The present inventors have made intensive studies to attain the above-described object. As a result, it has been found that according to conventional thinking, when a solution obtained by dissolving or dispersing materials for forming a layer having various functions in a solvent is stored for a certain period of time, precipitation, aggregation or crystallization of the solute is generated and affects the element characteristics, but this thinking does not apply to the solution after filtering.

Also, further intensive studies have lead to a finding that when the solution above is filtered and after passing of a certain period of time, used for wet film formation to manufacture an element, the above-described object can be attained. The present invention has been accomplished based on these findings.

That is, the gist of the present invention resides in the followings.
1. A process of producing an organic electroluminescence element composition, comprising a filtration step of filtering a solution containing an organic electroluminescence element material and a solvent, wherein the composition is obtained after a time-elapsing step wherein 8 hours or more elapses after the filtration step, and the composition is used for a wet film formation of an organic layer in an organic electroluminescence element.

2. The process of producing an organic electroluminescence element composition as described in the item 1 above, wherein the molecular weight of the organic electroluminescence element material is from 100 to 10,000.

3. The process of producing an organic electroluminescence element composition as described in the item 1 or 2 above, wherein the organic electroluminescence element material is a luminescent layer material.

4. An organic electroluminescence element composition, produced by the process of producing an organic electroluminescence element composition as described in any one of the items 1 to 3 above.

5. A process of producing an organic electroluminescence element comprising an organic layer between an anode and a cathode, wherein the organic layer is formed by a wet film formation of a composition that is obtained after a solution containing an organic electroluminescence element material and a solvent is filtered and then 8 hours or more elapses.

6. A process of producing an organic electroluminescence element comprising an organic layer between an anode and a cathode, wherein the organic layer is formed by a wet film formation of the organic electroluminescence element composition as described in the item 4 above.

7. An organic electroluminescence element obtained by the process of producing an organic electroluminescence element as described in the item 5 or 6 above.

8. An organic EL display device comprising the organic electroluminescence element as described in the item 7 above.

9. An organic EL lighting comprising the organic electroluminescence element as described in the item 7 above.

Advantage of the Invention

According to the process of producing an organic electroluminescence element composition of the present invention, a composition for manufacturing an element with a high current efficiency and a long drive life by a wet film formation method can be obtained.

The organic electroluminescence element manufactured by the method of the present invention has a high current efficiency and a long drive life and therefore, is considered to be applicable to a flat panel/display (such as OA computer display or wall-hanging television), a light source utilizing the characteristics as a surface illuminant (such as light source of copiers, and backlight source of liquid crystal displays or gauges), a display board, and a marker lamp, and its technical value is high.

BRIEF DESCRIPTION OF THE DRAWINGS

FIG. 1 is a cross-sectional view schematically showing one example of the structure of the organic electroluminescence element of the present invention.

MODE FOR CARRYING OUT THE INVENTION

The embodiments of the process of producing an organic electroluminescence element composition, the organic electroluminescence element composition, the use method of the organic electroluminescence element composition, the process of producing an organic electroluminescence element, the organic electroluminescence element, the organic EL display device and the organic EL lighting, of the present invention are described in detail below.

However, the following description of the constituent element is an example (a representative example) of the embodiment of the present invention, and the present invention is not limited to these contents as long as the purport of the present invention is observed. In the present invention, "wt %" has the same meaning as "mass %".

[1] Process of Producing Composition for Organic Electroluminescence Element

The process of producing an organic electroluminescence element composition of the present invention (hereinafter, sometimes referred to as "the process of producing a composition of the present invention") includes a filtration step of filtering a solution containing an organic electroluminescence element material and a solvent. Also, the composition is a composition obtained through a time-elapsing step of leaving the solution after the filtration step to pass 8 hours or more and is used for wet film formation of an organic layer of an organic electroluminescence element.

[Operation Mechanism]

Details of the operation mechanism providing the effects in the present invention are presumed as follows. When a solution containing an organic electroluminescence element material and a solvent is filtered by using, for example, a filter, the solution is put into an unstable state by the filtration. More specifically, for example, a hardly detectable cluster of very fine size is formed by the contact of an organic electroluminescence element material in the composition with a filter or the like.

It is presumed that when a solution in such an unstable sate is used in a wet film formation step, a fine cluster or the like exists in the deposited film and impairs electric characteristics and, for example, the drive life and the luminous efficiency are reduced.

On the other hand, in the present invention, a time-elapsing step for a predetermined period is provided after the filtration step, and this is considered to enable obtaining a composition in which a fine cluster or the like generated at the filtration step is decomposed. It is thought that wet film formation using this composition affords decrease in the ratio of the cluster or the like contained in the film obtained, as a result, there is provided an effect such as long drive life and high luminous efficiency of the element obtained.

[Composition for Organic Electroluminescence Element]

The organic electroluminescence element composition of the present invention contains an organic electroluminescence element material and a solvent. Here, the organic electroluminescence element material may be dissolved in a solvent or may be dispersed in a solvent.

{Organic Electroluminescence Element Material}

The organic electroluminescence element material is a material contained in a layer between an anode and a cathode of an organic electroluminescence element. The organic electroluminescence element material includes, for example, a charge transport material having a hole transportability or an electron transportability, a luminescent material, and an electron-accepting compound. The organic electroluminescence element material is not particularly limited, and an appropriate material can be selected according to the organic layer formed, or a known material may be also used.

The molecular weight of the organic electroluminescence element material for use in the present invention is arbitrary as long as the effects of the present invention are not seriously impaired. The molecular weight of the organic electroluminescence element material for use in the present invention is preferably 10,000 or less, more preferably 5,000 or less, still more preferably 4,000 or less, yet still more preferably 3,000 or less. The molecular weight of the organic electroluminescence element material for use in the present invention is, usually, preferably 100 or more, more preferably 200 or more, still more preferably 300 or more, yet still more preferably 400 or more.

The molecular weight of the organic electroluminescence element material is preferably large in terms of the fact that the glass transition temperature, melting point, decomposition temperature or the like is high, leading to excellent heat resistance of the luminescent layer material and the luminescent layer formed, and there hardly occurs, for example, reduction in the film quality due to gas generation, recrystallization, molecular migration or the like, or increase in the impurity concentration involved in thermal decomposition of the material. On the other hand, the molecular weight of the organic electroluminescence element material is preferably small from the standpoint that purification of the organic compound is easy and dissolution in a solvent is facilitated.

The organic electroluminescence element material for use in the present invention is preferably a luminescent layer material. In the following, among others, a case where the organic electroluminescence element material is a luminescent layer material, that is, a case where the organic electroluminescence element composition of the present invention is a luminescent layer-forming composition, is described in detail as an example. Embodiments other than the luminescent layer-forming composition include, for example, the materials and solvents described later in the paragraph of [4] Organic Electroluminescence Element.

The luminescent layer-forming composition as the organic electroluminescence element composition of the present invention preferably contains a luminescent layer material and a solvent. As the luminescent layer material, at least a luminescent material is preferably contained, and it is more preferred to further contain a charge transport material. Also, for the purpose of enhancing the deposition property, the luminescent layer material may contain various additives such as leveling agent and defoaming agent.

<Luminescent Material>

The luminescent material is not limited as long as it is a material usually used as a luminescent material of an organic electroluminescence element. The luminescent material may be, for example, a fluorescent material or a phosphorescent material. Also, as the luminescent material, a fluorescent material and a phosphorescent material may be used in combination, for example, by using a fluorescent material for blue and using a phosphorescent material for green and red.

(Fluorescent Material)

Out of the luminescent materials, examples of the fluorescent material are described below. However, the fluorescent material is not limited to these examples.

Examples of the fluorescent material giving blue luminescence (blue fluorescent dye) include naphthalene, chrysene, perylene, pyrene, anthracene, coumarin, p-bis(2-phenylethenyl)benzene, arylamine, and derivatives thereof. Among these, anthracene, chrysene, pyrene, arylamine and derivatives thereof are preferred as the fluorescent material giving blue luminescence.

Examples of the fluorescent material giving green luminescence (green fluorescent dye) include quinacridone, coumarin, an aluminum complex such as $Al(C_9H_6NO)_3$, and derivatives thereof.

Examples of the fluorescent material giving yellow luminescence (yellow fluorescent dye) include rubrene, perimidone, and derivatives thereof.

Examples of the fluorescent material giving red luminescence (red fluorescent dye) include a DCM (4-(dicyanomethylene)-2-methyl-6-(p-dimethylaminostyryl)-4H-pyran)- based compound, benzopyran, rhodamine, a xanthene such as benzothioxanthene and azabenzothioxanthene, and derivatives thereof.

As for the arylamine derivative that is a derivative giving blue fluorescence, more specifically, in view of luminous efficiency, drive life and the like of the element, the fluorescent material is preferably a compound represented by the following formula (X):

[Chem. 1]

(X)

In formula (X), $Ar^{21}$ represents a substituted or unsubstituted fused aromatic ring group having a nuclear carbon number of 10 to 40, each of $Ar^{22}$ and $Ar^{23}$ independently represents a substituted or unsubstituted monovalent aromatic group having a carbon number of 6 to 40, and p represents an integer of 1 to 4.

Specifically, $Ar^{21}$ includes, for example, naphthalene, phenanthrene, fluoranthene, anthracene, pyrene, perylene, coronene, chrysene, picene, diphenylanthracene, fluorene, triphenylene, rubicene, benzoanthracene, phenylanthracene, bisanthracene, dianthracenylbenzene and dibenzoanthracene, each having one free valence.

The term "free valence" as used in the present invention means a valence capable of forming a bond with another free valence as described in *Yuki Kagaku/Sei-Kagaku Meimeiho* (*Organic Chemistry/Biochemistry Nomenclature*), (first volume) (revised 2nd edition, Nankodo, 1992).

Specific preferred examples of the arylamine derivative as a fluorescent material are illustrated below, but the arylamine derivative as a fluorescent material for use in the present invention is not limited thereto. In the following, "Me" indicates a methyl group, and "Et" indicates an ethyl group.

[Chem. 2]

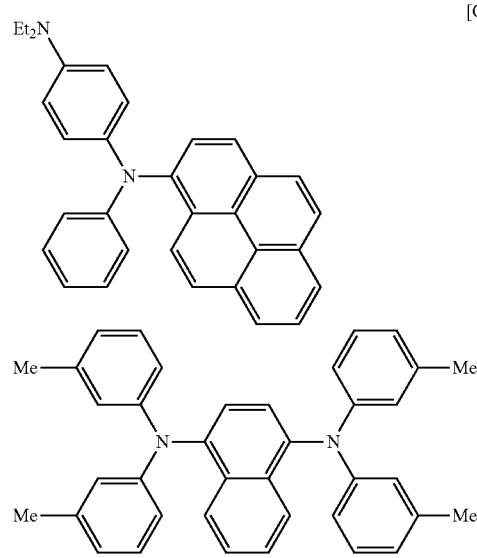

7
-continued
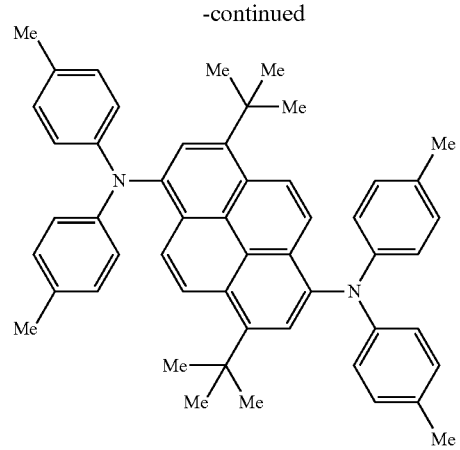
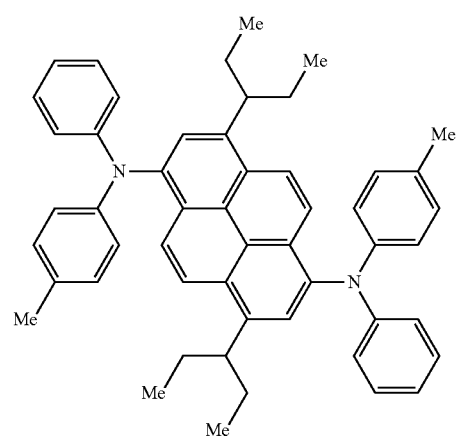
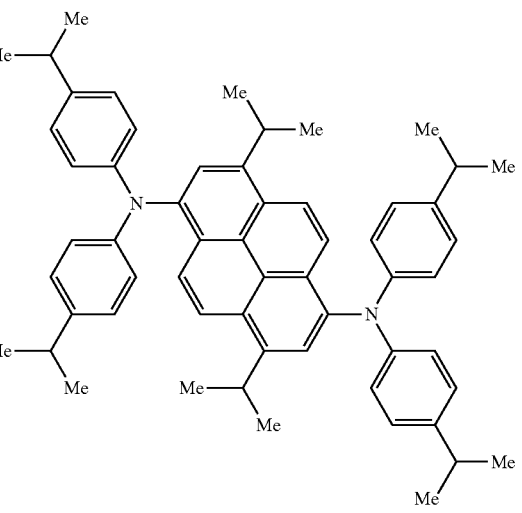
8
-continued
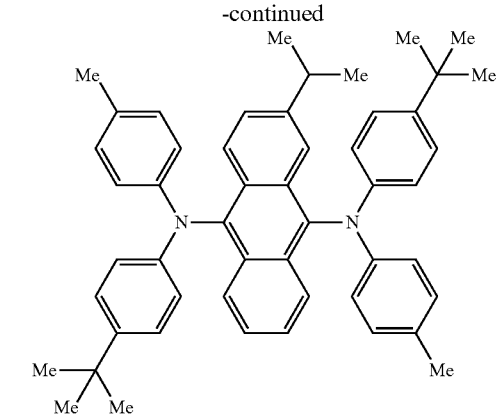
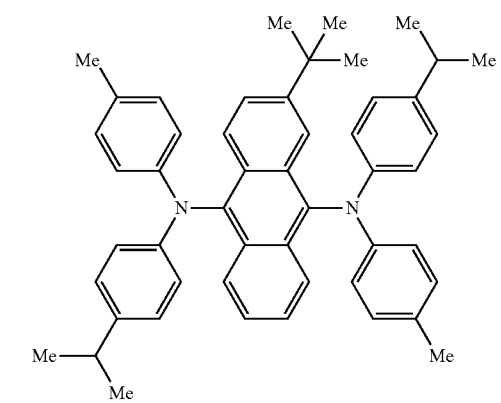
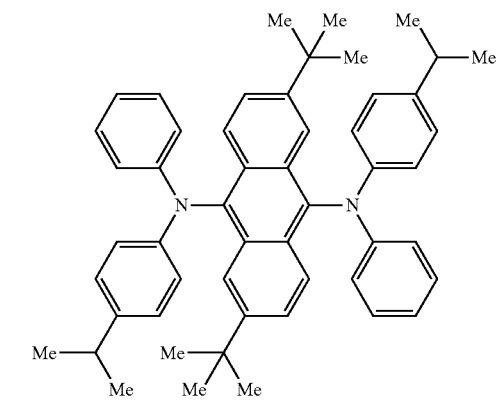
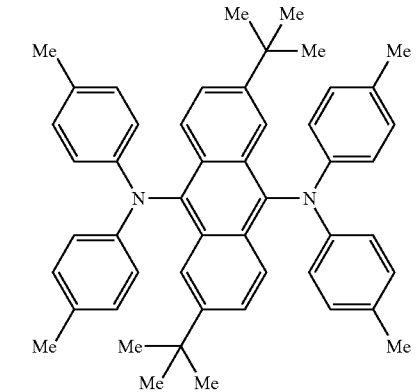

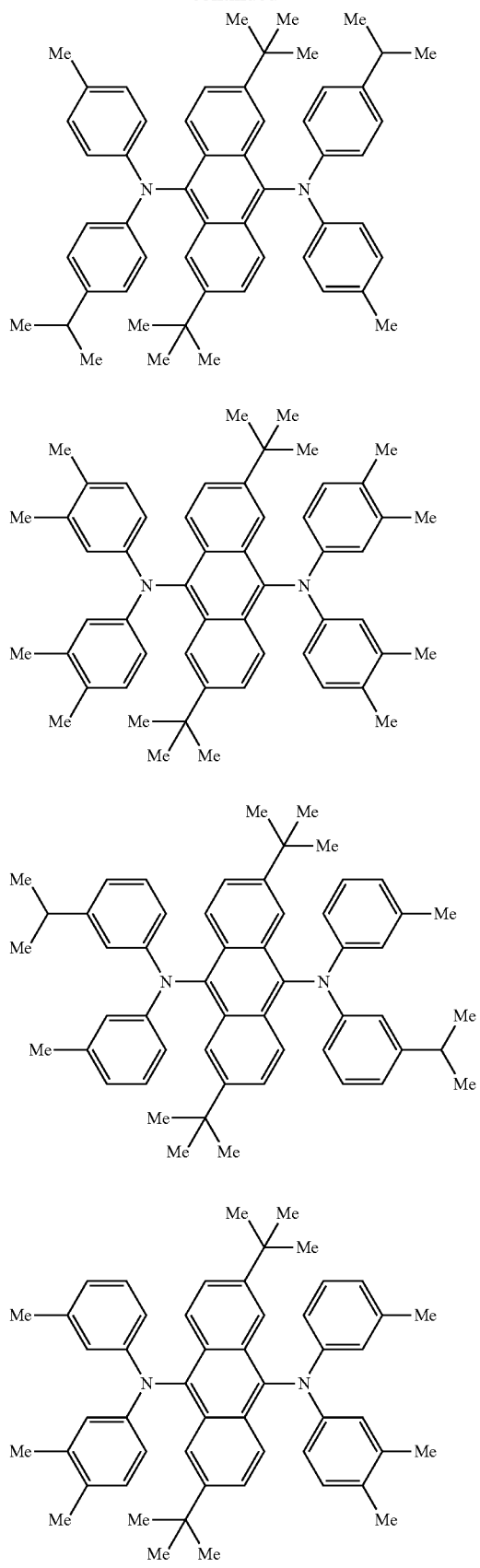
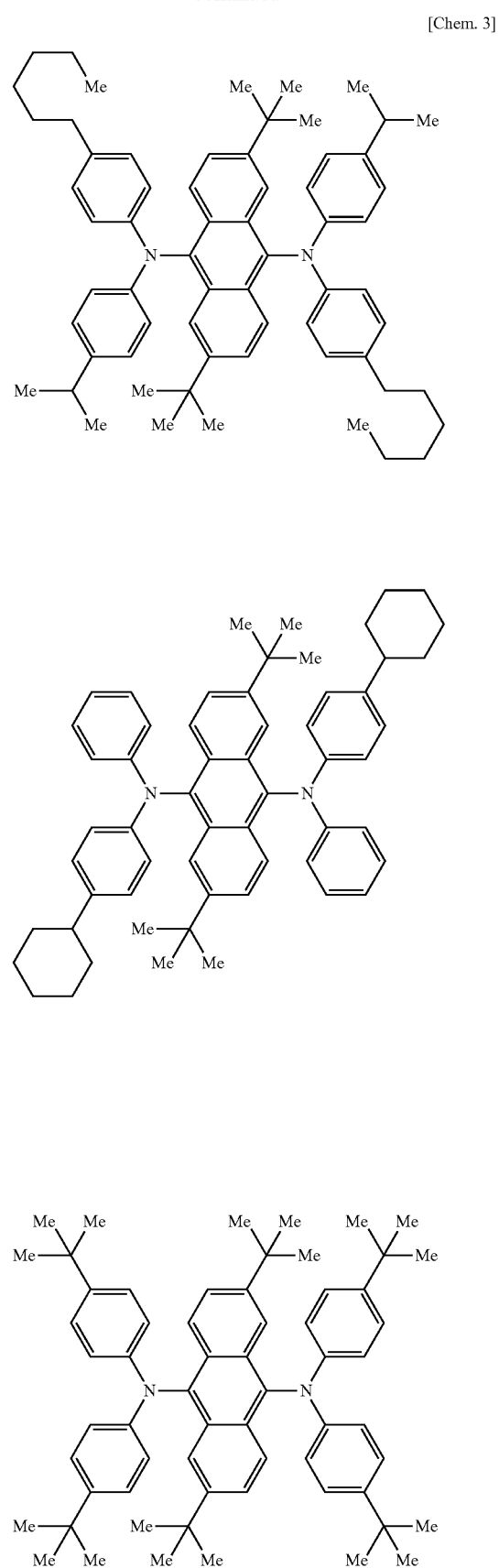

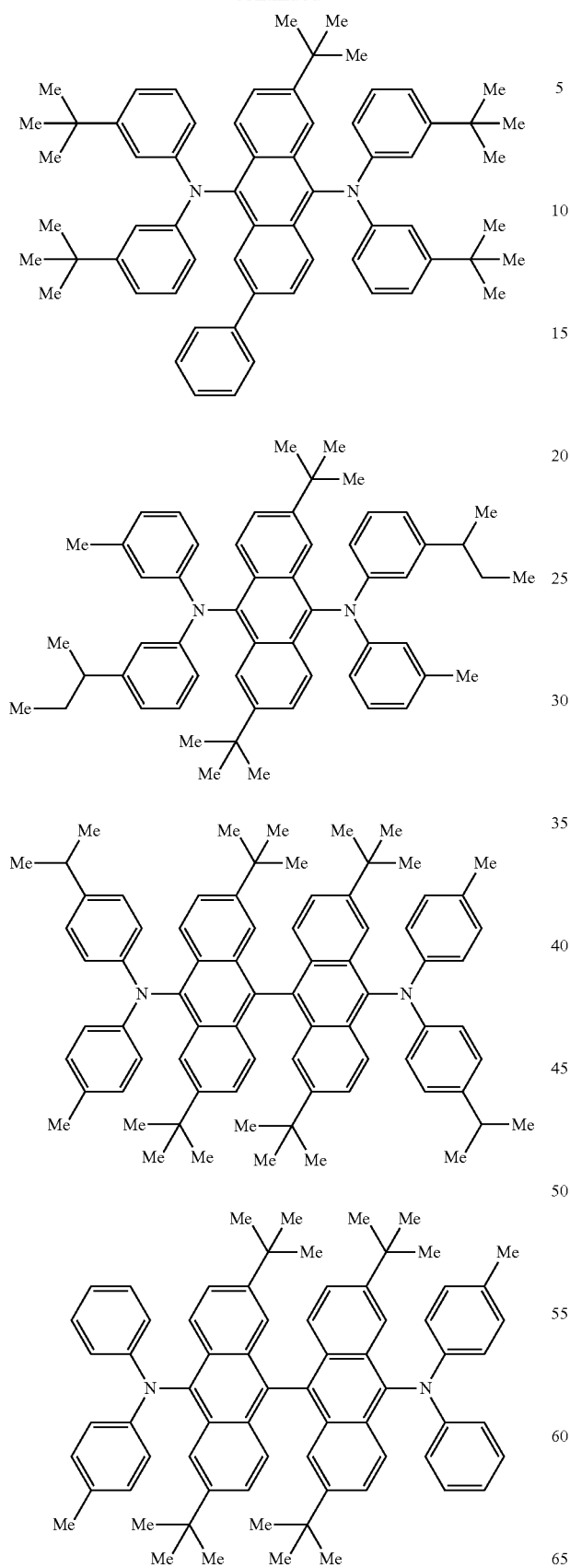
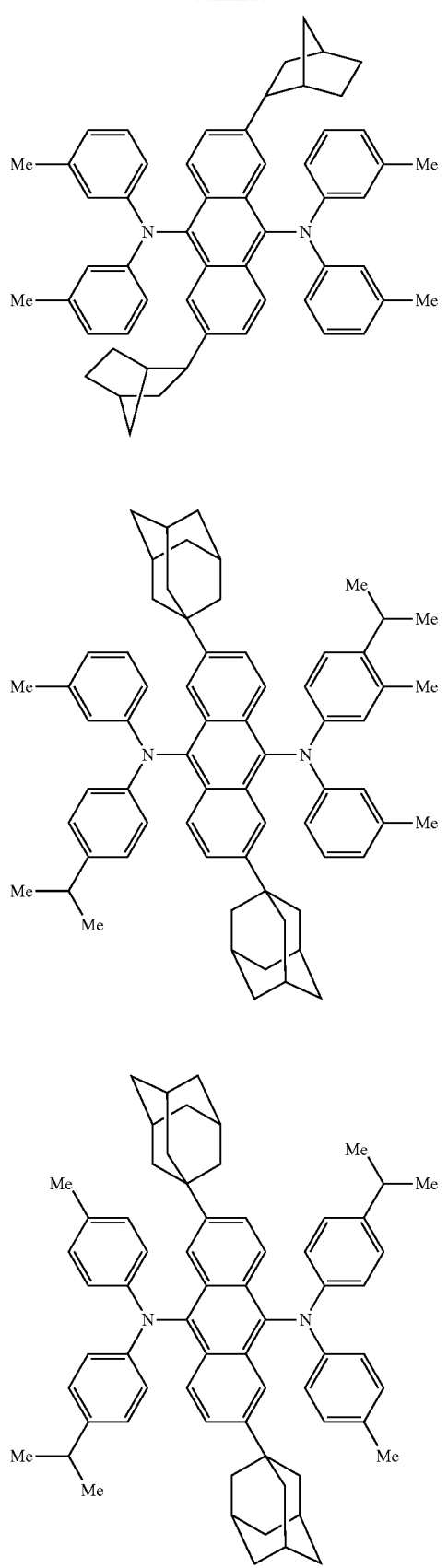

13
-continued
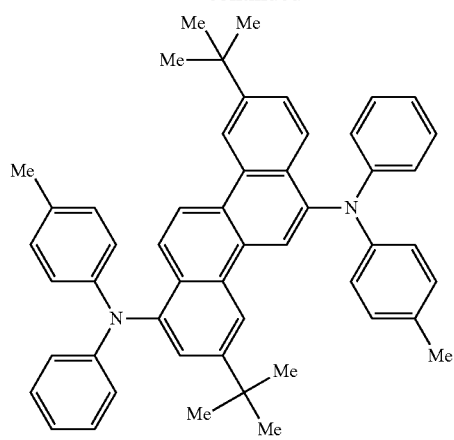
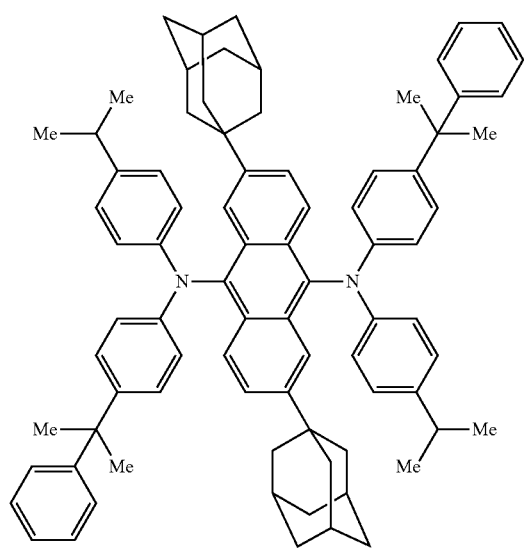
[Chem. 4]
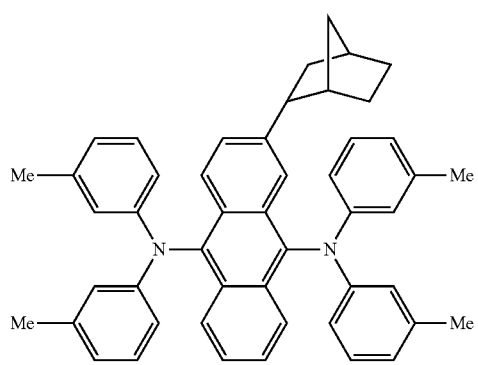
14
-continued
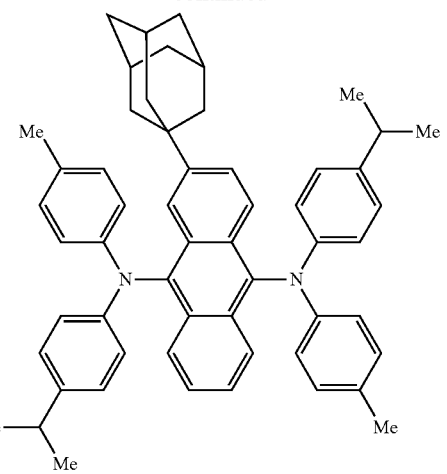
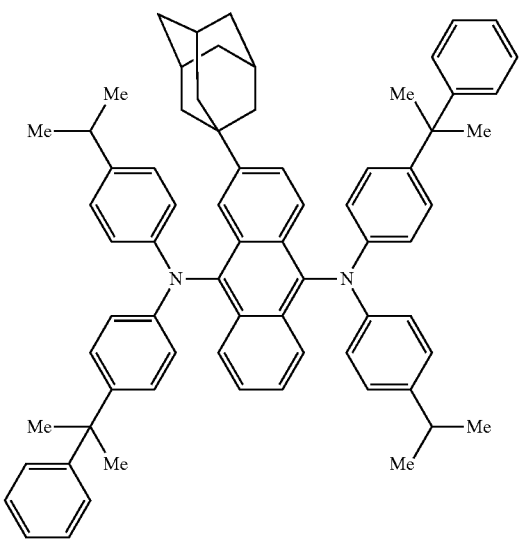
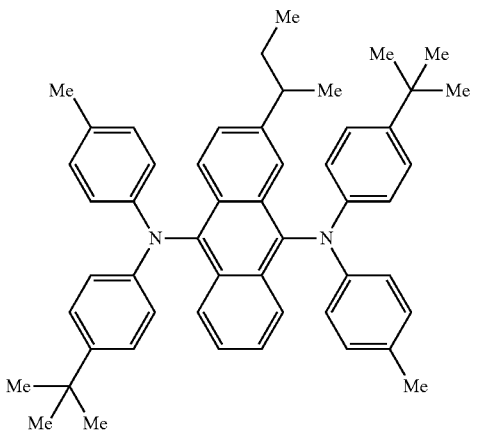

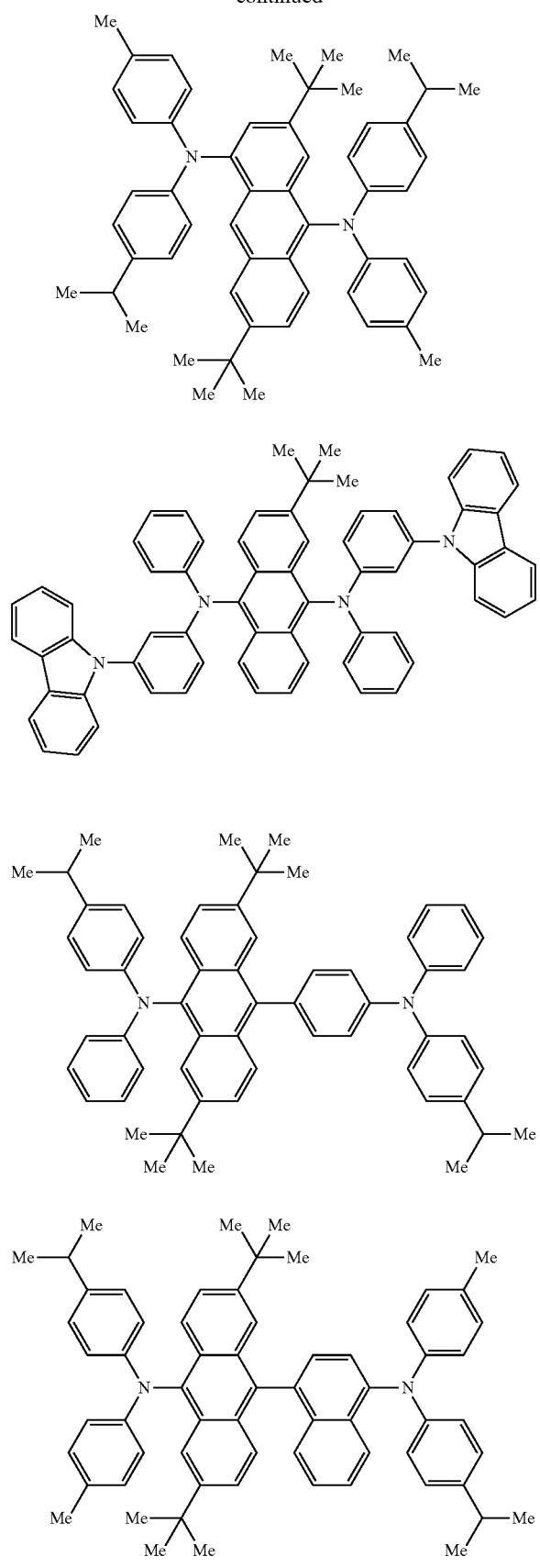
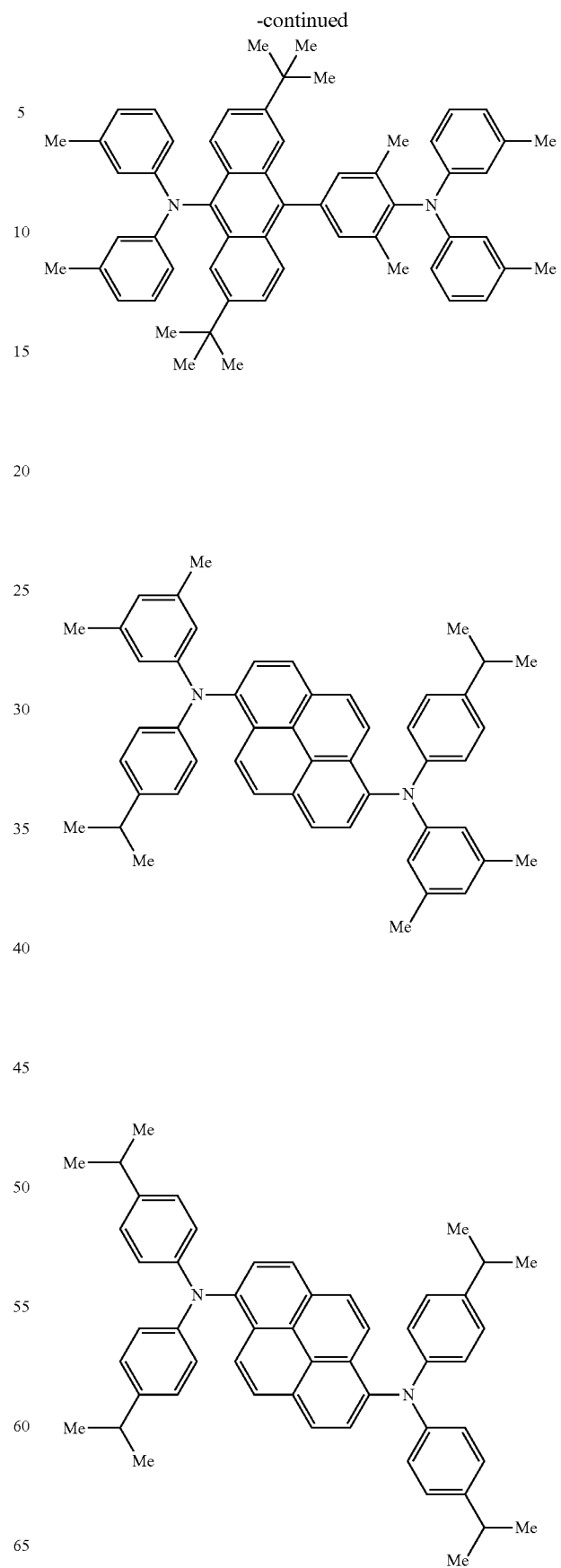

-continued
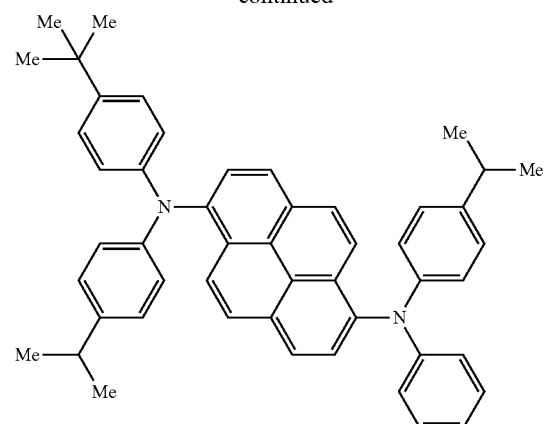
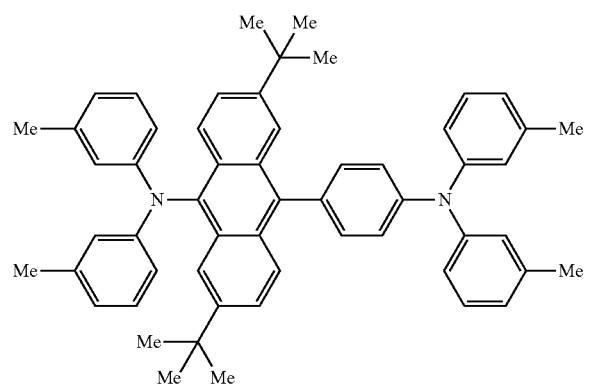
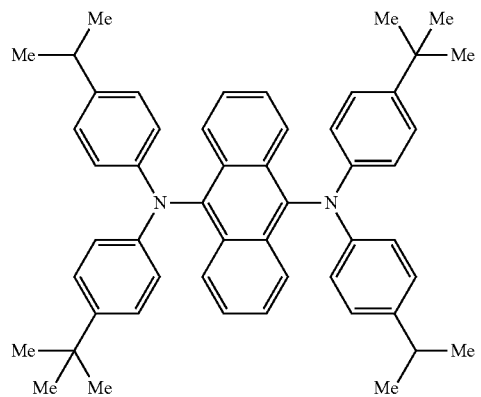
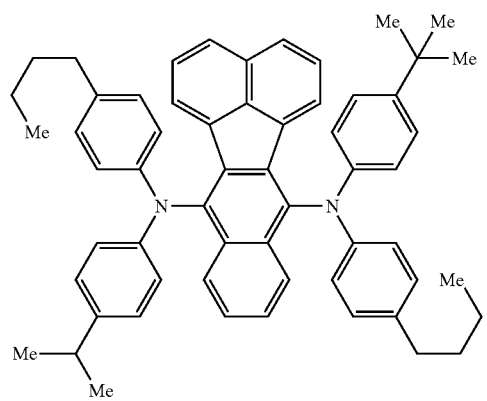
[Chem. 5]
-continued
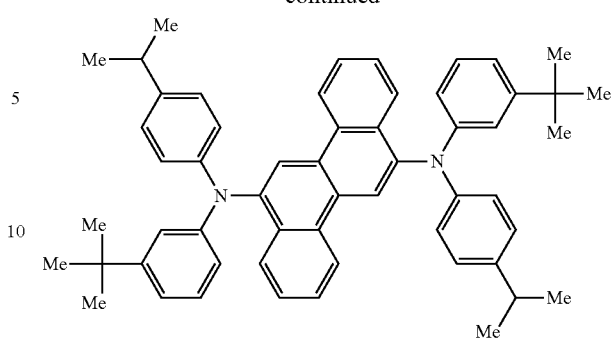
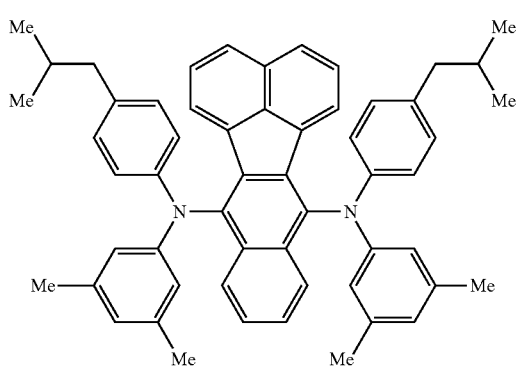
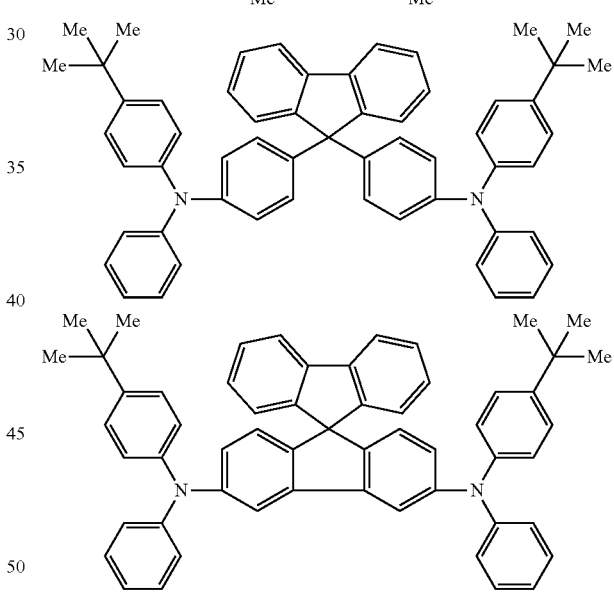
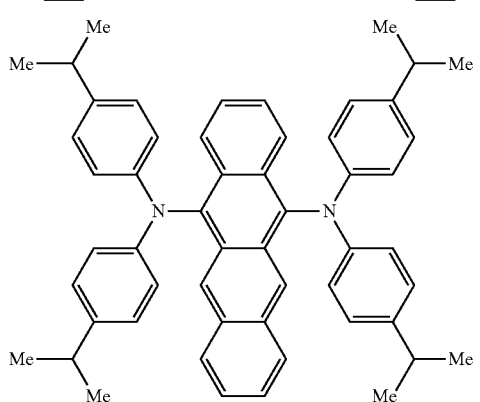

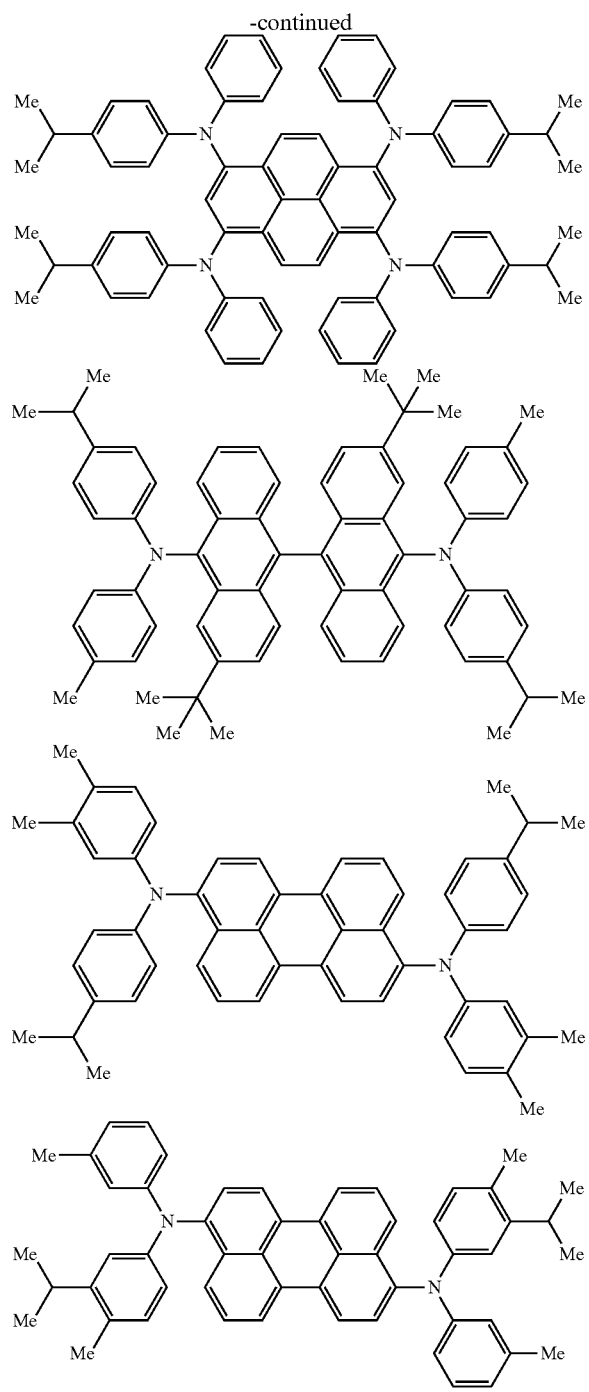

(Phosphorescent Material)

The phosphorescent material includes, for example, a Werner type complex and an organometallic complex each containing a metal selected from Groups 7 to 11 of the long periodic table (hereinafter, unless otherwise indicated, the "periodic table" indicates the long periodic table) as the central metal.

Preferred examples of the metal selected from Groups 7 to 11 of the periodic table include ruthenium, rhodium, palladium, silver, rhenium, osmium, iridium, platinum and gold. Among these, iridium and platinum are more preferred as the metal selected from Groups 7 to 11 of the periodic table.

The ligand of the complex is preferably a ligand where a (hetero)aryl group is coupled with pyridine, pyrazole, phenanthroline or the like, such as (hetero)arylpyridine ligand and (hetero)arylpyrazole ligand. In particular, a phenylpyridine ligand and a phenylpyrazole ligand are preferred. Here, the (hetero)aryl indicates an aryl group or a heteroaryl group.

Specific examples of the phosphorescent material include tris(2-phenylpyridine)iridium, tris(2-phenylpyridine)ruthenium, tris(2-phenylpyridine)palladium, bis(2-phenylpyridine)platinum, tris(2-phenylpyridine)osmium, tris(2-phenylpyridine)rhenium, octaethyl platinum porphyrin, octaphenyl platinum porphyrin, octaethyl palladium porphyrin, and octaphenyl palladium porphyrin.

Above all, the phosphorescent organic metal complex as a phosphorescent material is preferably, for example, a compound represented by the following formula (III) or (IV):

In formula (III), M represents a metal, q represents the valence of the metal, each of L and L' represents a bidentate ligand, and j represents a number of 0, 1 or 2.

[Chem. 6]

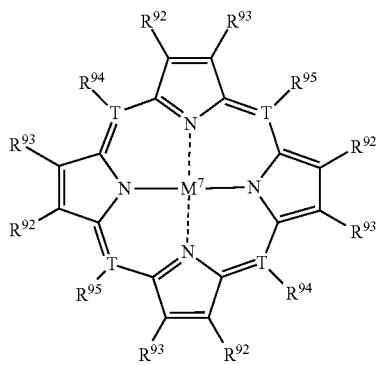

In formula (IV), $M^7$ represents a metal, T represents a carbon atom or a nitrogen atom, and each of $R^{92}$ to $R^{95}$ independently represents a substituent, provided that when T is a nitrogen atom, $R^{94}$ and $R^{95}$ are not present.

The compound represented by formula (III) is described below.

In formula (III), M represents an arbitrary metal, and specific preferred examples of M include the metals described above as the metal selected from Groups 7 to 11 of the periodic table.

Also, in formula (III), the bidentate ligand L indicates a ligand having the following partial structure:

[Chem. 7]

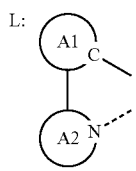

In the partial structure of L above, the ring A1 represents an aromatic ring group, which may have a substituent. The aromatic ring group in the present invention may be an aromatic hydrocarbon group or an aromatic heterocyclic group.

The aromatic hydrocarbon group includes, for example, a 5- or 6-membered monocyclic ring and a 2- to 5-condensed ring, each having one free valence.

Specific examples of the aromatic hydrocarbon group include a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring and a fluorene ring, each having one free valence.

The aromatic heterocyclic group includes, for example, a 5- or 6-membered monocyclic ring and a 2- to 4-condensed ring, each having one free valence.

Specific examples of the aromatic heterocyclic group include a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a benzimidazole ring, a perimidine ring, a quinazoline ring, a quinazolinone ring, and an azulene ring, each having one free valence.

In the partial structure of L above, the ring A2 represents a nitrogen-containing aromatic heterocyclic group which may have a substituent.

The nitrogen-containing aromatic heterocyclic group includes, for example, a 5- or 6-membered monocyclic ring and a 2- to 4-condensed ring, each having one free valence.

Specific examples of the nitrogen-containing aromatic heterocyclic group include a pyrrole ring, a pyrazole ring, an imidazole ring, an oxadiazole ring, an indole ring, a carbazole ring, a pyrroloimidazole ring, a pyrrolopyrazole ring, a pyrrolopyrrole ring, a thienopyrrole ring, a furopyrrole ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a quinoxaline ring, a phenanthridine ring, a benzimidazole ring, a perimidine ring, a quinazoline ring, and a quinazolinone ring, each having one free valence.

Examples of the substituent which may be substituted on each of the rings A1 and A2 include a halogen atom; an alkyl group; an alkenyl group; an alkoxycarbonyl group; an alkoxy group; an aryloxy group; a dialkylamino group; a diarylamino group; a carbazolyl group; an acyl group; a haloalkyl group; a cyano group; and an aromatic hydrocarbon group. In the case where the ring A1 or A2 is a nitrogen-containing aromatic heterocyclic group, the ring may have an aromatic hydrocarbon group as a substituent.

In formula (III), the bidentate L' indicates a ligand having a partial structure shown below. In the following formulae, "Ph" indicates a phenyl group.

[Chem. 8]

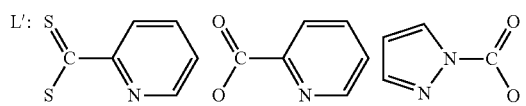

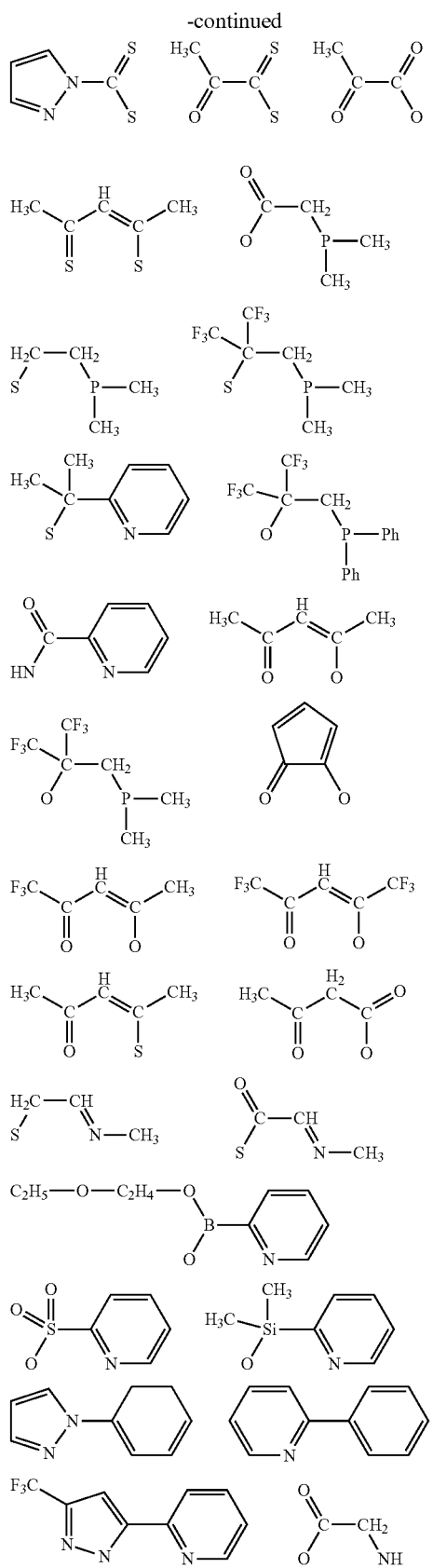

In view of stability of the complex, L' is preferably a ligand shown below.

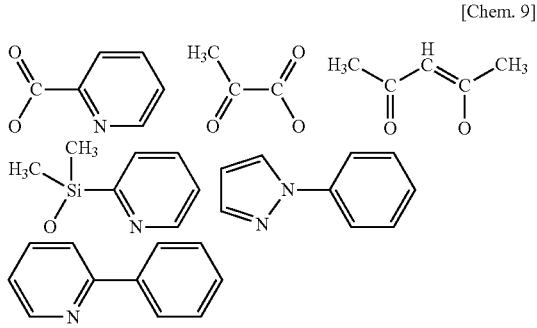

The compound represented by formula (III) is more preferably a compound represented by the following formula (IIIa), (IIIb) or (IIIc):

[Chem. 10]

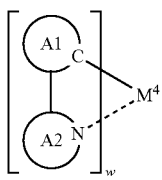

(IIIa)

In formula (IIIa), $M^4$ represents the same metal as M, w represents the valence of the metal, the ring A1 represents an aromatic ring group which may have a substituent, and the ring A2 represents a nitrogen-containing aromatic heterocyclic group which may have a substituent.

[Chem. 11]

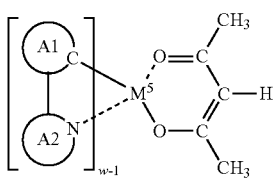

(IIIb)

In formula (IIIb), $M^5$ represents the same metal as M, w represents the valence of the metal, the ring A1 represents an aromatic ring group which may have a substituent, and the ring A2 represents a nitrogen-containing aromatic heterocyclic group which may have a substituent.

[Chem. 12]

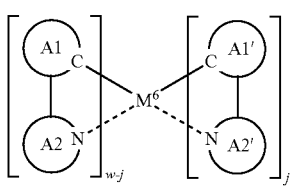

(IIIc)

In formula (IIIc), $M^6$ represents the same metal as M, w represents the valence of the metal, j represents 0, 1 or 2, each of the rings A1 and A1' independently represents an aromatic ring group which may have a substituent, and each of the rings A2 and A2' independently represents a nitrogen-containing aromatic heterocyclic group which may have a substituent.

In formulae (IIIa) to (IIIc), preferred examples of the aromatic ring group of the rings A1 and A1' include a phenyl group, a biphenyl group, a naphthyl group, an anthryl group, a thienyl group, a furyl group, a benzothienyl group, a benzofuryl group, a pyridyl group, a quinolyl group, an isoquinolyl group, and a carbazolyl group.

In formulae (IIIa) to (IIIc), preferred examples of the nitrogen-containing heterocyclic group of the rings A2 and A2' include a pyridyl group, a pyrimidyl group, a pyrazyl group, a triazyl group, a benzothiazole ring, a benzoxazole ring, a benzimidazole ring, a quinolyl ring, an isoquinolyl group, a quinoxalyl group, and a phenanthridyl group.

Examples of the substituent which may be substituted on each of the aromatic ring group of the rings A1 and A1' and the nitrogen-containing aromatic heterocyclic group of the rings A2 and A2' in formulae (IIIa) to (IIIc) include a halogen atom; an alkyl group; an alkenyl group; an alkoxycarbonyl group; an alkoxy group; an aryloxy group; a dialkylamino group; a diarylamino group; a carbazolyl group; an acyl group; a haloalkyl group; and a cyano group.

These substituents may combine with each other to form a ring. As a specific example, a substituent on the ring A1 and a substituent on the ring A2 may combine or a substituent on the ring A1' and a substituent on the ring A2' may combine, to form one condensed ring. Examples of such a condensed ring include a 7,8-benzoquinoline group.

Above all, an alkyl group, an alkoxy group, an aromatic hydrocarbon group, a cyano group, a halogen atom, a haloalkyl group, a diarylamino group, a carbazolyl group and the like are preferred as the substituent on the rings A1, A1', A2 and A2'.

Preferred examples of $M^4$ to $M^6$ in formulae (IIIa) to (IIIc) include ruthenium, rhodium, palladium, silver, rhenium, osmium, iridium, platinum and gold.

Specific examples of the organometallic complexes represented by formulae (III) and (IIIa) to (IIIc) are illustrated below, but specific examples of the organometallic complexes represented by formulae (III) and (IIIa) to (IIIc) are not limited to these compounds.

[Chem. 13]

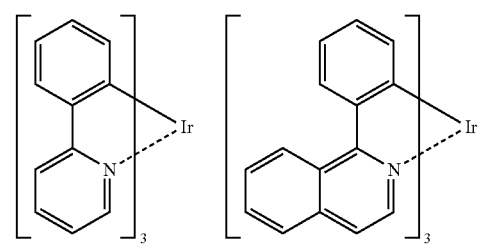

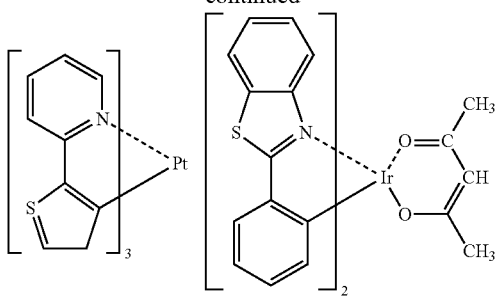
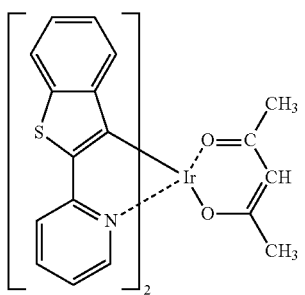
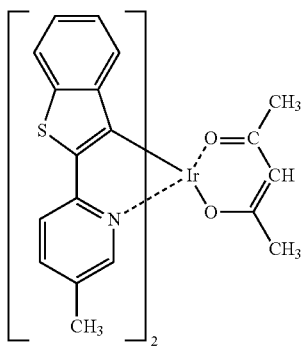
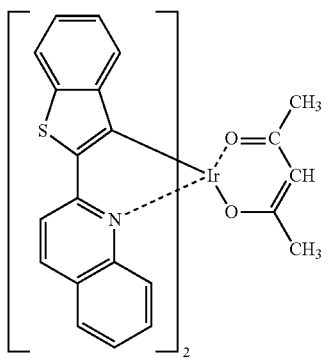
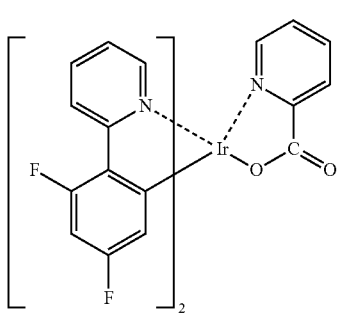
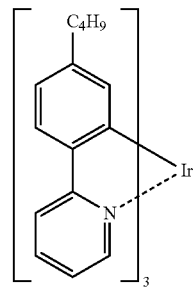
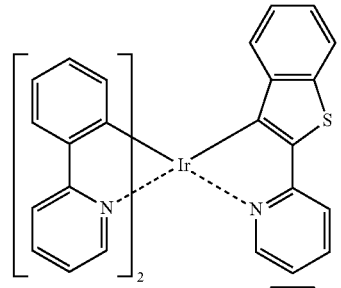
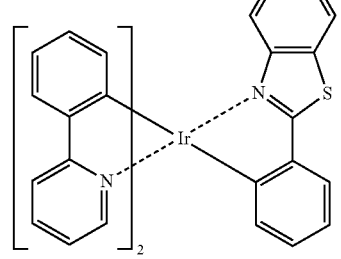
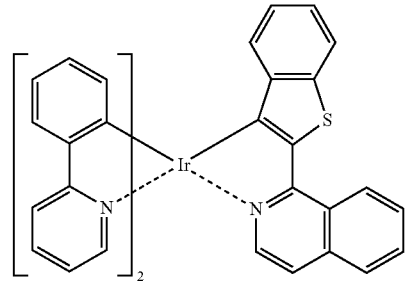
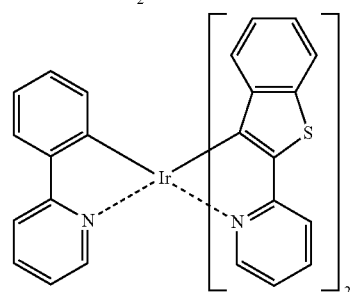
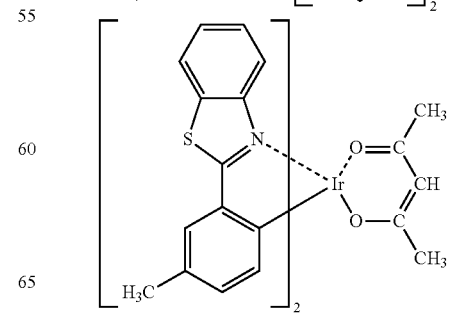

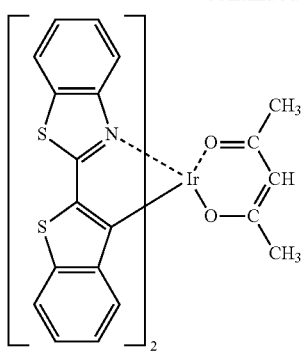

[Chem. 14]

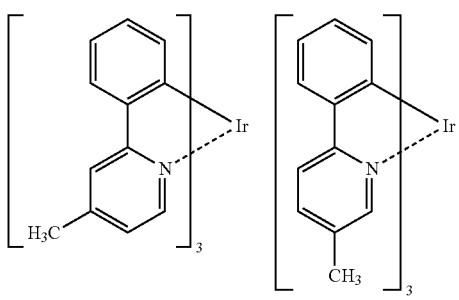

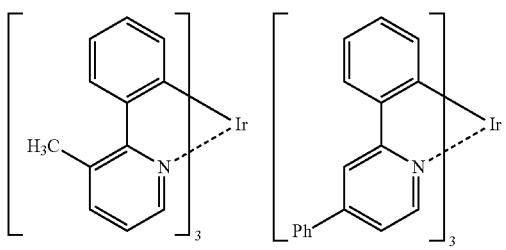

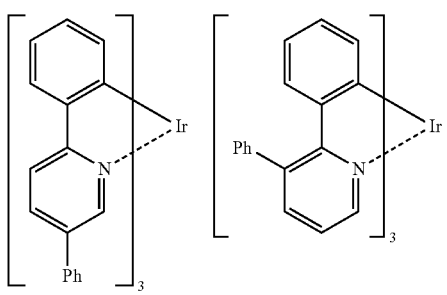

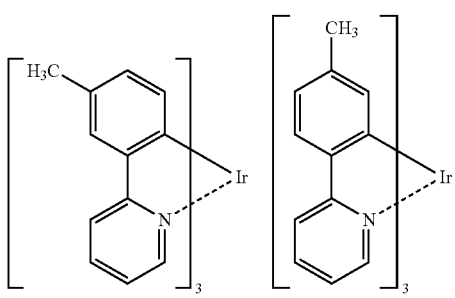

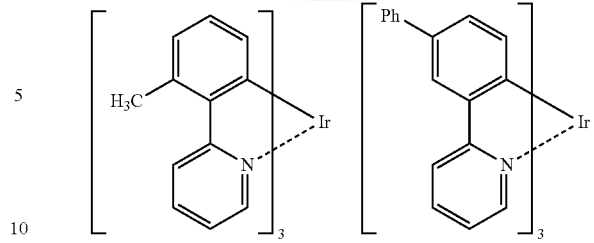

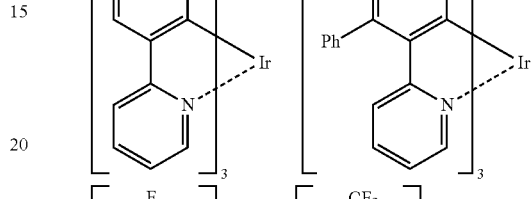

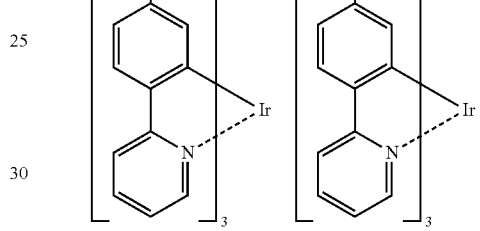

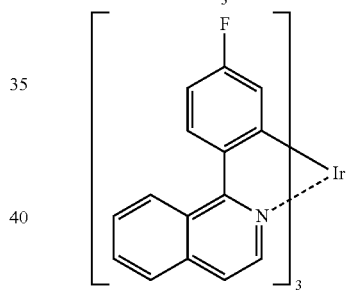

Among the organometallic complexes represented by formula (III), compounds having, as the ligand L and/or L', a 2-arylpyridine-based ligand, that is, a 2-arylpyridine, or a ligand formed by bonding an arbitrary substituent or fusing an arbitrary group to the ligand above are preferred.

In addition, the compounds described in International Publication No. 2005/019373 may be also used as the luminescent material.

The compound represented by formula (IV) is described below.

In formula (IV), $M^7$ represent a metal. Specific examples thereof include the metals described above as the metal selected from Groups 7 to 11 of the periodic table. Among these, $M^7$ is preferably ruthenium, rhodium, palladium, silver, rhenium, osmium, iridium, platinum or gold, more preferably a divalent metal such as platinum and palladium.

In formula (IV), each of $R^{92}$ and $R^{93}$ independently represents a hydrogen atom, a halogen atom, an alkyl group, an aralkyl group, an alkenyl group, a cyano group, an amino group, an acyl group, an alkoxycarbonyl group, a carboxyl group, an alkoxy group, an alkylamino group, an aralkylamine group, a haloalkyl group, a hydroxyl group, an aryloxy group, an aromatic ring group.

In the case where T is a carbon atom, each of $R^{94}$ and $R^{95}$ independently represents a substituent whose examples are the same as those for $R^{92}$ and $R^{93}$. Also, when T is a nitrogen atom, $R^{94}$ and $R^{95}$ are not present.

Each of $R^{92}$ to $R^{95}$ may further have a substituent. In the case of having a substituent, the kind of the substituent is not particularly limited, and an arbitrary group may be the substituent.

Two or more groups out of $R^{92}$ to $R^{95}$ may combine with each other to form a ring.

Specific examples (T-1, T-10 to T-15) of the organometallic complex represented by formula (IV) are illustrated below, but the present invention is not limited to these examples. In the following chemical formula, "Me" indicates a methyl group, and Et indicates an ethyl group.

[Chem. 15]

(T-1)
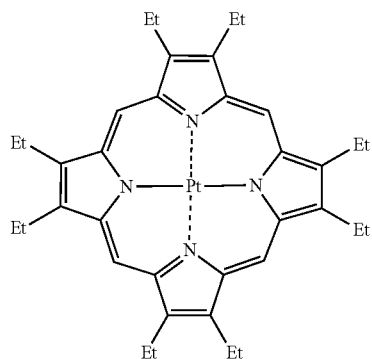

(T-10)
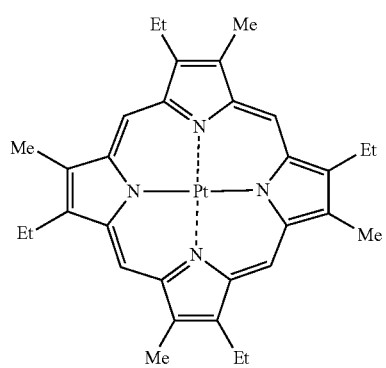

(T-11)
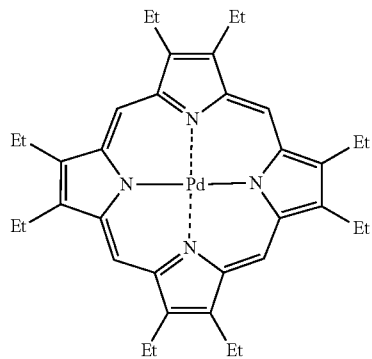

(T-12)
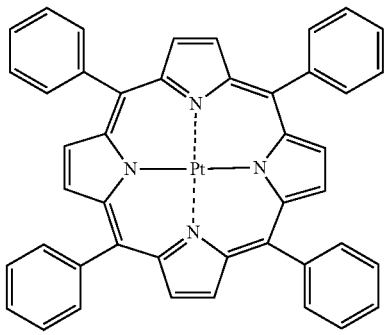

(T-13)
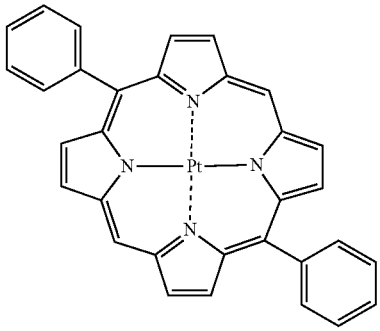

(T-14)
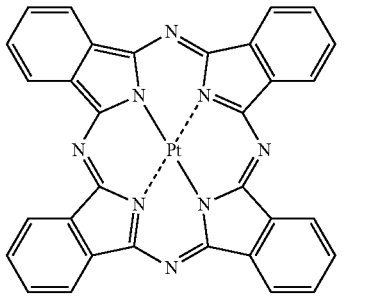

(T-15)
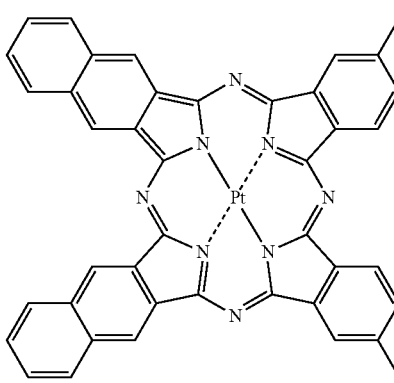

As for these luminescent materials, one kind may be used alone, or two or more kinds may be used in arbitrary combination at an arbitrary ratio.

(Molecular Weight)

The molecular weight of the luminescent material for use in the present invention is arbitrary as long as the effects of the present invention are not seriously impaired. The molecular weight of the luminescent material for use in the present invention is preferably 10,000 or less, more preferably 5,000 or less, still more preferably 4,000 or less, yet still more preferably 3,000 or less. Also, the molecular weight of the luminescent material for use in the present invention is, usually, preferably 100 or more, more preferably 200 or more, still more preferably 300 or more, yet still more preferably 400 or more.

The molecular weight of the luminescent material is preferably large in terms of the fact that the glass transition temperature, melting point, decomposition temperature or the like is high, leading to excellent heat resistance of the luminescent layer material and the luminescent layer formed, and there hardly occurs, for example, reduction in the film quality due to gas generation, recrystallization, molecular migration or the like, or increase in the impurity concentration involved in thermal decomposition of the material. On the other hand, the molecular weight of the luminescent material is preferably small from the standpoint that purification of the organic compound is easy and dissolution in a solvent is facilitated.

<Charge Transport Material>

The luminescent layer-forming composition for use in the present invention preferably contains a charge transport material.

In the organic electroluminescence element, the luminescent material preferably emits light by receiving an electric charge or an energy from a host material having a charge transporting performance. Accordingly, the luminescent layer material contained in the luminescent layer-forming composition according to the present invention is preferably, for example, a charge transport material used as the host material. The charge transport material includes, for example, a compound having hole transportability and a compound having electron transportability.

Examples of the charge transport material include an aromatic amine-based compound, a phthalocyanine-based compound, a porphyrin-based compound, a thiophene-based compound, a benzylphenyl-based compound, a fluorene-based compound, a hydrazone-based compound, a silazane-based compound, a silanamine-based compound, a phosphamine-based compound, a quinacridone-based compound, a triphenylene-based compound, a carbazole-based compound, a pyrene-based compound, an anthracene-based compound, a phenanthroline-based compound, a quinoline-based compound, a pyridine-based compound, a triazine-based compound, an oxadiazole-based compound, and an imidazole-based compound.

More specifically, examples of the hole transporting compound having a low molecular weight include an aromatic amine-based compound containing two or more tertiary amines, in which two or more fused aromatic rings are substituted on the nitrogen atom, typified by 4,4'-bis[N-(1-naphthyl)-N-phenylamino]biphenyl (JP-A-5-234681); an aromatic amine-based compound having a starburst structure, such as 4,4',4''-tris(1-naphthylphenylamino)triphenylamine (*Journal of Luminescence*, Vol. 72-74, page 985, 1997); an aromatic amine-based compound composed of a tetramer of triphenylamine (*Chemical Communications*, page 2175, 1996); and a fluorene-based compound such as 2,2',7,7'-tetrakis-(diphenylamino)-9,9'-spirobifluorene (*Synthetic Metals*, Vol. 91, page 209, 1997). Also, compounds exemplified later in (Hole Transporting Compound with Low Molecular Weight) of [Hole Injection Layer] may be used.

Examples of the electron transporting compound having a low molecular weight include 2,5-bis(1-naphthyl)-1,3,4-oxadiazole (BND), 2,5-bis(6'-(2',2''-bipyridyl))-1,1-dimethyl-3,4-diphenylsilole (PyPySPyPy), bathophenanthroline (BPhen), 2,9-dimethyl-4,7-diphenyl-1,10-phenanthroline (BCP, bathocuproine), 2-(4-biphenylyl)-5-(p-tert-butylphenyl)-1,3,4-oxadiazole (tBu-PBD), and 4,4'-bis(9-carbazole)-biphenyl (CBP).

As for these charge transport materials, one kind may be used alone, or two or more kinds may be used in arbitrary combination at an arbitrary ratio.

The molecular weight of the charge transport material for use in the present invention is arbitrary as long as the effects of the present invention are not seriously impaired. The molecular weight of the charge transport material for use in the present invention is, usually, preferably 10,000 or less, more preferably 5,000 or less, still more preferably 4,000 or less, yet still more preferably 3,000 or less. Also, the molecular weight of the charge transport material for use in the present invention is, usually, preferably 100 or more, more preferably 200 or more, still more preferably 300 or more, yet still more preferably 400 or more.

The molecular weight of the charge transport material is preferably in the range above from the standpoint, for example, that the glass transition temperature, melting point or decomposition temperature is high, and the luminescent layer material and the luminescent layer formed are excellent in the heat resistance; that there hardly occurs, for example, reduction in the film quality due to recrystallization or molecular migration or increase in the impurity concentration involved in thermal decomposition of the material, and the element performance is excellent; and that purification is easy.

[Solvent]

The luminescent layer-forming composition for use in the present invention usually preferably further contains a solvent. The solvent is not particularly limited as long as it is a solvent capable of successfully dissolving or dispersing the luminescent layer material such as luminescent material and charge transport layer.

As for the solubility in the solvent, each of the luminescent material and the charge transport material is usually dissolved in an amount of preferably 0.01 wt % or more, more preferably 0.05 wt % or more, still more preferably 0.1 wt % or more, at 25° C. under 1 atom.

Specific examples of the solvent are described below, but the solvent is not limited thereto as long as the effects of the present invention are not impaired.

Examples of the solvent include alkanes such as n-decane, cyclohexane, ethylcyclohexane, decalin and bicyclohexane; aromatic hydrocarbons such as toluene, xylene, mesitylene, cyclohexylbenzene, tetramethylcyclohexanone and tetralin; halogenated aromatic hydrocarbons such as chlorobenzene, dichlorobenzene and trichlorobenzene; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole and diphenylether; aromatic esters such as phenyl acetate, phenyl propionate, methyl benzoate, ethyl benzoate, propyl benzoate and n-butyl benzoate; alicyclic ketones such as cyclohexanone, cyclooctanone and fenchone; alicyclic alcohols such as cyclohexanol and cyclooctanol; aliphatic ketones such as methyl ethyl ketone and dibutyl ketone; aliphatic alcohols such as butanol and hexanol; and aliphatic ethers such as ethylene glycol dimethyl ether, ethylene glycol diethyl ether and propylene glycol-1-monomethyl ether acetate (PG-MEA).

Among these solvents, alkanes and aromatic hydrocarbons are preferred.

As for these solvents, one kind may be used alone, or two or more kinds may be used in arbitrary combination at an arbitrary ratio.

In order to obtain a more uniform film, the solvent is preferably evaporated at an appropriate rate from the liquid film immediately after deposition. On this account, the boiling point of the solvent is, usually, preferably 80° C. or more, more preferably 100° C. or more, still more preferably 120° C. or more. Also, the boiling point of the solvent is usually, preferably 270° C. or less, more preferably 250° C. or less, still more preferably 230° C. or less.

[Formulation]

The content of the solvent in the luminescent layer-forming composition according to the present invention is arbitrary as long as the effects of the present invention are not seriously impaired. The content of the solvent is preferably 10 parts by weight or more, more preferably 50 parts by weight or more, still more preferably 80 parts by weight or more, per 100 parts by weight of the luminescent layer-forming composition. Also, the content of the solvent is preferably 99.95 parts by weight or less, more preferably 99.9 parts by weight or less, still more preferably 99.8 parts by weight or less.

The content of the solvent in the luminescent layer-forming composition is preferably large in view of low viscosity and excellent workability of film deposition. On the other hand, the content of the solvent is preferably small from the standpoint that the thickness of the film obtained by removing the solvent after film deposition is easily gained and film deposition is facilitated. In the case where two or more solvents are mixed and used as the luminescent layer-forming composition, the total of these solvents preferably satisfies the range above.

The luminescent layer-forming composition for use in the present invention contains the luminescent material usually in an amount of preferably 0.01 wt % or more, more preferably 0.05 wt % or more, still more preferably 0.1 wt % or more. Also, the composition contains the luminescent material usually in an amount of preferably 20 wt % or less, more preferably 10 wt % or less, still more preferably 5 wt % or less.

The luminescent layer-forming composition for use in the present invention contains the charge transport material usually in an amount of preferably 0.1 wt % or more, more preferably 0.5 wt % or more, still more preferably 1 wt % or more. Also, the composition contains the charge transport material usually in an amount of preferably 20 wt % or less, more preferably 10 wt % or less, still more preferably 5 wt % or less.

In the luminescent layer-forming composition, the weight ratio (luminescent material/charge transport material) of the contents of the luminescent material and the charge transport material is, usually, preferably 0.01 or more, more preferably 0.03 or more. Also, in the luminescent layer-forming composition, the weight ratio (luminescent material/charge transport material) of the contents of the luminescent material and the charge transport material is, usually, preferably 0.5 or less, more preferably 0.2 or less.

[Filtration Step]

The process of producing an organic electroluminescence element composition of the present invention has a step of filtering a solution containing an organic electroluminescence element material and a solvent.

The filtration in the present invention is performed for the purpose of removing aggregates, impurities and particles which may be present in the solution containing an organic electroluminescence element material and a solvent. The filtration method is not particularly limited and includes known methods. Examples thereof include a filter having physical pores or voids, a filler, and an ion exchange resin.

The pore size of the filter used in the filtration step is, usually, preferably 5 μm or less, more preferably 0.5 μm or less. Also, the pore size of the filter used in the filtration step is, usually, preferably 0.1 μm or more. The pore size in this range is preferred because, for example, mixing of impurities or clogging of the filter hardly occurs.

The filler includes, for example, a resin having a function of removing impurities by a molecular sieving function, an electrostatic effect or the like, and a ceramic porous body. Representative examples of the filler include a porous polymer gal used in GPC (gel permeation chromatography), silica gel, zeolite, and activated carbon.

The ion exchange resin includes, for example, a resin having an action of removing an inorganic/organic cation such as sodium ion, calcium ion and ammonium ion, an inorganic/organic anion such as hydroxide ion and sulfide ion, and the like, by an electrostatic effect.

As for these various filtration methods, only one kind may be performed, or two or more kinds may be performed in arbitrary combination and arbitrary order.

Incidentally, the filtration step may be performed immediately after the preparation of the solution containing an organic electroluminescence element material and a solvent. Also, the filtration step may be performed about 12 to 24 hours after the preparation of the solution containing an organic electroluminescence element material and a solvent.

However, like a nozzle with a filter, in the case where a filter for filtration is mounted in an apparatus for wet depositing an organic layer of an organic electroluminescence element, the filtration step according to the present invention is not included, because the time from contact of the solution supplied to the apparatus with the filter to film deposition is very short and the film deposition completes before fine clusters in such a large amount as affecting the element characteristics are formed in the solution. The expression "the time from contact of the solution supplied to the apparatus with the filter to film deposition is very short" indicates usually within 5 minutes, preferably within 3 minutes, more preferably within 1 minute.

[Time-Elapsing Step]

The organic electroluminescence element composition of the present invention is a composition obtained after a time-elapsing step wherein 8 hours or more elapses after the filtration step, and the composition is used for a wet film formation of an organic layer of an organic electroluminescence element.

The time-elapsing step as used in the present invention indicates the period from filtration of the solution containing an organic electroluminescence element material and a solvent to formation of an organic layer by a wet film formation method. That is, the time-elapsing step in the present invention indicates the period after the solution containing an organic electroluminescence element material and a solvent is filtered until the solution fills a wet film formation apparatus and is used for film formation.

Incidentally, in the case where the solution containing an organic electroluminescence element material and a solvent is filtered plural times, the step indicates the period from final filtration to formation of an organic layer by a wet film formation method.

The period of the time-elapsing step is, usually, preferably 8 hours or more, more preferably 12 hours or more, still more preferably 24 hours or more, yet still more preferably 36 hours or more. Also, the period of the time-elapsing step is, usually, preferably 3 months or less, more preferably 2 months or less, still more preferably 1 month or less.

A long elapsing period is preferred in terms of the fact that a cluster or the like produced in the filtration step is likely to be decomposed. Also, a short elapsing period is preferred from the standpoint that the organic electroluminescence element material is substantially kept from deterioration, aggregation, precipitation or the like due to mixing of oxygen.

The environment of the time-elapsing step is not particularly limited and includes, for example, an inert gas environment and an atmospheric environment. The environment of the time-elapsing step is preferably an inert gas environment, because the organic electroluminescence element material is substantially kept from deterioration, aggregation, precipitation or the like. Specifically, preferred examples of the inert gas include nitrogen and argon. A mixed gas thereof may be also used as the inert gas. In view of easy handling, the inert gas is preferably a nitrogen gas.

The pressure in the time-elapsing step is, usually, preferably an atmospheric pressure. The temperature in the time-elapsing step is not particularly limited as long as the excellent effects of the present invention are not seriously impaired. The temperature in the time-elapsing step is, usually, preferably −40° C. or more, more preferably −20° C. or more, still more preferably −40° C. or more. Also, the temperature in the time-elapsing step is, usually, preferably 60° C. or less, more preferably 40° C. or less. When the temperature in the time-elapsing step is in the range above, this is preferred from the standpoint that the organic electroluminescence element material is substantially kept from deterioration, aggregation, precipitation and the like.

The humidity in the time-elapsing step is not particularly limited as long as the effects of the present invention are not impaired. The humidity in the time-elapsing step is, usually, in terms of relative humidity, preferably 90% or less, more preferably 80% or less, still more preferably 70% or less. Also, the humidity in the time-elapsing step is, usually, in terms of relative humidity, preferably 0% or more, more preferably 20% or more. When the humidity is in the range above, this is preferred from the standpoint that the organic electroluminescence element material is substantially kept from deterioration, aggregation, precipitation and the like.

In the time-elapsing step, the solution after filtration is preferably stored in a closed vessel, because volatilization of the solvent hardly occurs. The vessel used in the time-elapsing step is preferably a vessel capable of shielding light from the standpoint that decomposition/polymerization of a polymerizable compound or the like is hardly caused by ultraviolet light.

The vessel used in the time-elapsing step is preferably, for example, a brown screw-top bottle with packing, or a stainless steel-made pressurized tank. Also, in view of streamlining the process of producing an organic electroluminescence element, the vessel used in the time-elapsing step is preferably capable of direct installation in a wet film formation apparatus.

[Wet Film Formation]

The organic electroluminescence element composition obtained by the production process of the present invention is used for wet film formation of an organic layer of an organic electroluminescence element after a time-elapsing step wherein 8 hours or more elapses after the filtration step.

The wet film formation method as used in the present invention means a method where a method of depositing a film in a wet system such as spin coating, dip coating, die coating, bar coating, blade coating, roll coating, spray coating, capillary coating, inkjet, nozzle printing, screen printing, gravure printing and flexo printing is employed as the film deposition method, that is, as the coating method, and the coated film by the film deposition method above is dried, thereby performing film formation.

Among these film deposition methods, a spin coating method, a spray coating method, an inkjet method and a nozzle printing method are preferred. This is because a wet film formation method is suited for liquid property of the organic electroluminescence element composition of the present invention used as the coating composition.

In the following, the film formed by a wet film formation method is sometimes referred to as a "coating film". In the present invention, the wet film formation step by a wet film formation method can be itself performed in a usual manner.

[2] Composition for Organic Electroluminescence Element

The organic electroluminescence element composition of the present invention is a composition produced by the above-described process of producing an organic electroluminescence element composition of the present invention.

[3] Process of Producing Organic Electroluminescence Element

The process of producing an organic electroluminescence element of the present invention is a method where an organic layer between an anode and a cathode of an organic electroluminescence element is formed, as described above, by a wet film formation of a composition obtained after filtering a solution containing an organic electroluminescence element material and a solvent and leaving the solution to pass a predetermined hours or more.

[4] Organic Electroluminescence Element

The organic electroluminescence element of the present invention is manufactured by the above-described process of producing an organic electroluminescence element, wherein an organic layer between an anode and a cathode, preferably a luminescent layer, of the organic electroluminescence element is formed by a wet film formation method.

In the following, the layer configuration of the organic electroluminescence element manufactured by the method of the present invention, its general formation method, and the like are described by referring to FIG. 1.

FIG. 1 is a schematic view of the cross-section showing a structural example of the organic electroluminescence element 10 of the present invention. In FIG. 1, 1 indicates a substrate, 2 indicates an anode, 3 indicates a hole injection layer, 4 indicates a hole transport layer, 5 indicates a luminescent layer, 6 indicates a hole blocking layer, 7 indicates an electron transport layer, 8 indicates an electron injection layer, and 9 indicates a cathode.

[Substrate]

The substrate 1 works out to a support of an organic electroluminescence element. For the substrate 1, a quartz or glass plate, a metal plate or foil, a plastic film or sheet, or the like is used. Among others, a glass plate or a transparent plate formed of a synthetic resin such as polyester, polymethacrylate, polycarbonate and polysulfone is preferred.

In the case of using a synthetic resin substrate, gas barrier property is preferably kept in mind. The gas barrier property of the substrate is preferably high, because deterioration of the organic electroluminescence element due to outside air passed through the substrate hardly occurs. On this account, a method of providing a dense silicon oxide film or the like on at least one surface of the synthetic resin substrate to ensure the gas barrier property is one preferred method.

[Anode]

The anode 2 fulfills the role of injecting a hole into the layer on the luminescent layer 5 side.

The anode 2 is usually composed of, for example, a metal such as aluminum, gold, silver, nickel, palladium and platinum, a metal oxide such as indium and/or tin oxide, a metal halide such as copper iodide, carbon black, or an electrically conductive polymer such as poly(3-methylthiophene), polypyrrole and polyaniline.

The anode 2 is usually formed by a sputtering method, a vacuum deposition method, or the like. In the case of forming the anode 2 by using, for example, a fine metal particle such as silver, a fine particle such as copper iodide, carbon black, a fine electrically conductive metal oxide particle or a fine electrically conductive polymer powder, the anode 2 can be also formed by dispersing such a fine particle or the like in an appropriate binder resin solution and coating the solution on the substrate 1.

Furthermore, in the case of an electrically conductive polymer, it is also possible to form a thin film directly on the substrate 1 by electrolytic polymerization. In addition, the anode 2 can be also formed by coating the electrically conductive polymer on the substrate 1 (see, Appl. Phys. Lett., Vol. 60, page 2711, 1992).

The anode 2 usually has a single-layer structure but, if desired, can have a multilayer structure composed of plural materials.

The thickness of the anode 2 may be appropriately selected according to the required transparency or the like. In the case where transparency is required, the transmittance for visible light is usually set to preferably 60% or more, more preferably 80% or more. In this case, the thickness of the anode 2 is, usually, preferably 5 nm or more, more preferably 10 nm or more.

On the other hand, in this case, the thickness of the anode 2 is, usually, preferably 1,000 nm or less, more preferably 500 nm or less. In the case where the anode 2 can be opaque, the thickness thereof is arbitrary. A substrate 1 functioning also as the anode 2 may be used. It is also possible to stack a different electrically conductive material on the anode 2.

The anode 2 surface is preferably subjected to an ultraviolet (UV)/ozone treatment or an oxygen plasma or argon plasma treatment so as to remove impurities attached to the anode 2 and adjust the ionization potential, thereby enhancing the hole injection performance.

[Hole Injection Layer]

The hole injection layer 3 is a layer for transporting a hole to the luminescent layer 5 from the anode 2. The hole injection layer 3 is not a layer essential for the organic electroluminescence element of the present invention, but in the case of providing a hole injection layer 3, the hole injection layer 3 is usually formed on the anode 2.

The method for forming the hole injection layer 3 according to the present invention may be either a vacuum deposition method or a wet film formation method and is not particularly limited. From the standpoint of reducing the dark spot, the hole injection layer 3 is preferably formed by a wet film formation method and is more preferably formed by a wet film formation of the above-described composition of the present invention.

The film thickness of the hole injection layer 3 is, usually, preferably 5 nm or more, more preferably 10 nm or more, and is, usually, preferably 1,000 nm or less, more preferably 500 nm or less.

{Formation of Hole Injection Layer by Wet Film Formation Method}

In the case of forming the hole injection layer 3 by a wet film formation method, usually, the material constituting the hole injection layer 3 (in the case of forming the hole injection layer 3 by a wet film formation of the composition of the present invention, the material corresponds to the above-described "organic electroluminescence element material") is mixed with an appropriate solvent (solvent for hole injection layer; in the case of forming the hole injection layer 3 by a wet film formation of the composition of the present invention, the solvent corresponds to the "solvent" of the above-described organic electroluminescence element composition) to prepare a composition for film deposition (hole injection layer-forming composition), and the hole injection layer 3-forming composition is coated and deposited on a layer corresponding to the underlying layer (usually anode 2) of the hole injection layer by an appropriate method and then dried, whereby the hole injection layer 3 is formed.

<Hole Transporting Compound>

The hole injection layer-forming composition usually contains a hole transporting compound as the constituent material of the hole injection layer 3, and a solvent.

The hole transporting compound may be a polymer compound such as polymer or a low molecular compound such as monomer if it is a compound usually employed for the hole injection layer 3 of an organic electroluminescence element, but a polymer compound is preferred.

In view of barrier to charge injection from the anode 2 to the hole injection layer 3, the hole transporting compound is preferably a compound having an ionization potential of 4.5 to 6.0 eV.

Examples of the hole transporting compound include an aromatic amine derivative, a phthalocyanine derivative, a porphyrin derivative, an oligothiophene derivative, a polythiophene derivative, a benzylphenyl derivative, a compound having tertiary amines connected through a fluorene group, a hydrazone derivative, a silazane derivative, a silanamine derivative, a phosphamine derivative, a quinacridone derivative, a polyaniline derivative, a polypyrrole derivative, a polyphenylenevinylene derivative, a polythienylenevinylene derivative, a polyquinoline derivative, a polyquinoxaline derivative, and carbon.

Incidentally, the derivative as used in the present invention encompasses, for example, in the case of an aromatic amine derivative, the aromatic amine itself and a compound where an aromatic amine forms the main skeleton, and the derivative may be a polymer or a monomer.

As to the hole transporting compound used as a material of the hole injection layer 3, any one of these compounds may be contained alone, or two or more thereof may be contained. In the case of containing two or more kinds of hole transporting compounds, the combination thereof is arbitrary, but it is preferred to use one kind or two or more kinds of aromatic tertiary amine polymer compounds and one kind or two or more kinds of other hole transporting compounds, in combination.

Among those compounds, in view of amorphous property and transmittance for visible light, an aromatic amine compound is preferred, and an aromatic tertiary amine compound is more preferred. The aromatic tertiary amine compound as used herein is a compound having an aromatic tertiary amine structure and encompasses also a compound having a group derived from an aromatic tertiary amine.

The aromatic tertiary amine compound is not particularly limited in its kind, but in view of uniform luminescence thanks to the surface smoothing effect, the aromatic tertiary amine compound is preferably a polymer compound having a weight average molecular weight of 1,000 to 1,000,000 (a polymerized compound of a type where repeating units are connected).

Preferred examples of the aromatic tertiary amine polymer compound include a polymer compound having a repeating unit represented by the following formula (I):

[Chem. 16]

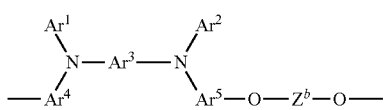

In formula (I), each of $Ar^1$ to $Ar^5$ independently represents an aromatic ring group which may have a substituent, $Z^b$ represents a linking group selected from the following linking groups, and out of $Ar^1$ to $Ar^5$, two groups bonded to the same N atom may combine with each other to form a ring:

[Chem. 17]

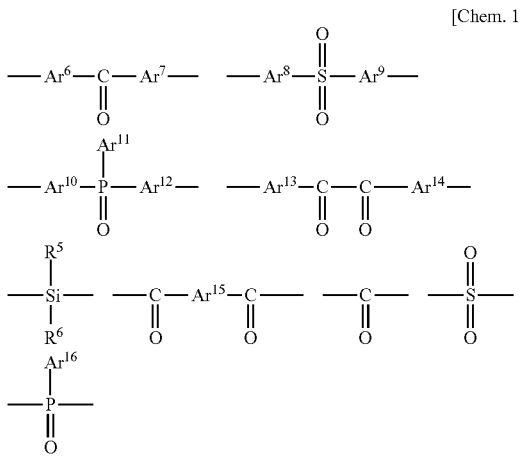

In formulae above, each of $Ar^6$ to $Ar^{16}$ independently represents an aromatic ring group which may have a substituent, and each of $R^1$ and $R^2$ independently represents a hydrogen atom or an arbitrary substituent.

In view of solubility, heat resistance and hole injection/transport property of the polymer compound, the aromatic ring group of $Ar^1$ to $Ar^{16}$ is preferably a benzene ring, a naphthalene ring, a phenanthrene ring, a thiophene ring or a pyridine ring, each having one or two free valences, more preferably a benzene ring or a naphthalene ring.

The aromatic ring group of $Ar^1$ to $Ar^{16}$ may further have a substituent. The molecular weight of the substituent is, usually, preferably 400 or less, more preferably about 250 or less. Preferred examples of the substituent include an alkyl group, an alkenyl group, an alkoxy group, and an aromatic ring group.

In the case where each of $R^1$ and $R^2$ is an arbitrary substituent, examples of the substituent include an alkyl group, an alkenyl group, an alkoxy group, a silyl group, a siloxy group, and an aromatic ring group.

Specific examples of the aromatic tertiary amine polymer compound having a repeating unit represented by formula (I) include the compounds described in International Publication No. 2005/089024.

As the hole transporting compound, an electrically conductive polymer (PEDOT/PSS) obtained by polymerizing 3,4-ethylenedioxythiophene as a polythiophene derivative in a high-molecular-weight polystyrenesulfonic acid is also preferred. Furthermore, the terminal of this polymer may be capped with a methacrylate or the like.

Incidentally, the hole transporting compound may be a crosslinkable compound described later in [Hole Transport Layer]. The same applied to the film deposition method when using the crosslinkable compound.

The concentration of the hole transporting compound in the hole injection layer-forming composition is arbitrary as long as the effects of the present invention are not seriously impaired. The concentration of the hole transporting compound in the hole injection layer-forming composition is usually, in view of uniform film thickness, preferably 0.01 wt % or more, more preferably 0.1 wt % or more, still more preferably 0.5 wt % or more. On the other hand, the concentration is, usually, preferably 70 wt % or less, more preferably 60 wt % or less, still more preferably 50 wt % or less. The concentration is preferably small in terms of the fact that film thickness unevenness hardly occurs. Also, this concentration is preferably large from the standpoint that a defect is scarcely produced in the hole injection layer deposited.

<Electron-Accepting Compound>

The hole injection layer-forming composition preferably contains an electron-accepting compound as a constituent material of the hole injection layer 3.

The electron-accepting compound is preferably a compound having oxidizing power and having an ability to accept one electron from the above-described hole transporting compound. Specifically, the electron-accepting compound is preferably a compound having an electron affinity of 4 eV or more, more preferably a compound having an electron affinity of 5 eV or more.

Such an electron-accepting compound includes, for example, one kind or two or more kinds of compounds selected from the group consisting of a triarylboron compound, a metal halide, a Lewis acid, an organic acid, an onium salt, a salt of arylamine with metal halide, and a salt of arylamine with Lewis acid.

Specific examples of the electron-accepting compound is include an organic group-substituted onium salt such as 4-isopropyl-4'-methyldiphenyliodonium tetrakis(pentafluorophenyl)borate and triphenylsulfonium tetrafluoroborate (International Publication No. WO2005/089024); a high-valence inorganic compound such as iron(III) chloride (JP-A-11-251067) and ammonium peroxodisulfate; a cyano compound such as tetracyanoethylene; an aromatic boron compound such as tris(pentafluorophenyl)borane (JP-A-2003-31365); a fullerene derivative; iodine; and a sulfonate ion such as polystyrenesulfonate ion, alkylbenzenesulfonate ion and camphorsulfonate ion.

Such an electron-accepting compound can enhance the electric conductivity of the hole injection layer 3 by oxidizing the hole transporting compound.

The content of the electron-accepting compound in the hole injection layer 3 or the hole injection layer-forming composition based on the hole transporting compound is, usually, preferably 0.1 mol % or more, more preferably 1 mol % or more, and is, usually, preferably 100 mol % or less, more preferably 40 mol % or less.

<Other Constituent Materials>

As the material of the hole injection layer 3, in addition to the above-described hole transporting compound and electron-accepting compound, other components may be further incorporated as long as the effects of the present invention are not seriously impaired. Examples of other components include various luminescent materials, electron transporting compounds, binder resins and coatability improvers. Incidentally, as for other components, only one component may be used, or two or more components may be used in arbitrary combination at an arbitrary ratio.

<Solvent>

Out of the solvents in the hole injection layer-forming composition used for a wet film formation method, at least one solvent is preferably a compound capable of dissolving the above-described constituent materials of the hole injection layer 3. The boiling point of the solvent is, usually, preferably 110° C. or more, more preferably 140° C. or more, still more preferably 200° C. or more, and is, usually, preferably 400° C. or less, more preferably 300° C. or less. The boiling point of the solvent is preferably high in terms of the fact that the drying rate is not too high and the film quality is excellent. On the other hand, the boiling point of the solvent is preferably low from the standpoint that drying at a low temperature is possible and other layers or the substrate are kept from the effect of heat.

Examples of the solvent include an ether-based solvent, an ester-based solvent, an aromatic hydrocarbon-based solvent, and an amide-based solvent.

Examples of the ether-based solvent include an aliphatic ether such as ethylene glycol dimethyl ether, ethylene glycol diethyl ether and propylene glycol-1-monomethyl ether acetate (PGMEA); and an aromatic ether such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole.

Examples of the ester-based solvent include an aromatic ester such as phenyl acetate, phenyl propionate, methyl benzoate, ethyl benzoate, propyl benzoate and n-butyl benzoate.

Examples of the aromatic hydrocarbon-based solvent include toluene, xylene, cyclohexylbenzene, 3-isopropylbiphenyl, 1,2,3,4-tetramethylbenzene, 1,4-diisopropylbenzene and methylnaphthalene.

Examples of the amide-based solvent include N,N-dimethylformamide and N,N-dimethylacetamide.

In addition, dimethylsulfoxide and the like may be also used.

Only one of these solvents may be used, or two or more thereof may be used in arbitrary combination at an arbitrary ratio.

<Film Formation Method>

After the preparation of the hole injection layer-forming composition, the composition is coated/deposited by a wet film formation method on a layer corresponding to the underlying layer (usually anode 2) of the hole injection layer 3 and dried to form the hole injection layer 3. In the formation of the hole injection layer 3, a composition obtained after filtering a solution containing the above-described material constituting the hole injection layer 3 and a solvent and leaving the solution to pass 8 hours or more is preferably used for wet film formation. In the formation of the hole injection layer 3, it is more preferred that a composition after filtering a solution containing a low molecular material constituting the hole injection layer 3 and a solvent and leaving the solution to pass 8 hours or more is used for wet film formation.

The temperature during coating is preferably 10° C. or more, more preferably 50° C. or less, because the film is less likely to have a defect due to production of a crystal in the composition. The relative humidity during coating is not limited as long as the effects of the present invention are not seriously impaired, but the relative humidity is, usually, preferably 0.01 ppm or more and 80% or less.

After the coating, the film of the hole injection layer-forming composition is usually dried. At the drying, the film may or may not be heated. In the case of drying under heating, examples of the heating means used therefor include a clean oven, a hot plate, an infrared ray, a halogen heater, and microwave irradiation. Among these, a clean oven and a hot plate are preferred, because heat is liable to be evenly applied throughout the film.

As for the heating temperature during heating, as long as the effects of the present invention are not seriously impaired, the heating is preferably performed at a temperature not lower than the boiling point of the solvent used in the hole injection layer-forming composition. In the case where the solvent used in the hole injection layer is a mixed solvent containing two or more kinds of solvents, the heating is preferably performed at a temperature not lower than the boiling point of at least one kind of the solvent.

Considering a rise in the boiling point of the solvent, the heating in the heating step is preferably performed at 120 to 410° C. At the heating, the heating temperature is not particularly limited, but in the case where a layer adjacent to the cathode side of the hole injection layer is formed by a wet film formation method, heating is preferably performed at a temperature high enough to sufficiently insolubilize the coating film.

The heating time at the heating is preferably 10 seconds or more and on the other hand, is, usually, preferably 180 minutes or less. The heating time is preferably short in terms of the fact that the components in other layers are less likely to diffuse, but the heating time is preferably long from the standpoint that a homogeneous hole injection layer is readily obtained. Heating may be performed in two or more portions.

{Formation of Hole Injection Layer 3 by Vacuum Deposition Method}

In the case of forming the hole injection layer 3 by vacuum deposition, for example, the hole transport layer 3 may be formed as follows. One material or two or more materials out of the constituent materials (for example, the above-described hole transporting compound and electron-accepting compound) of the hole injection layer 3 are put in a crucible (in the case of using two or more materials, in respective crucibles) placed in a vacuum vessel, and the inside of the vacuum vessel is evacuated to about $10^{-4}$ Pa by a vacuum pump.

The crucible is then heated (in the case of using two or more materials, respective crucibles are heated) to cause evaporation by controlling the evaporated amount (in the case of using two or more materials, by independently controlling the evaporated amount of each material), whereby a hole injection layer 3 is formed on the anode 2 of the substrate 1 placed to face the crucible. Incidentally, in the case of using two or more materials, the hole injection layer 3 may be also formed by putting a mixture of these materials in a crucible and heating the mixture to cause evaporation.

The degree of vacuum at the vapor deposition is not limited as long as the effects of the present invention are not seriously impaired. The degree of vacuum is, usually, preferably $0.1 \times 10^{-6}$ Torr ($0.13 \times 10^{-4}$ Pa) or more and is preferably $9.0 \times 10^{-6}$ Torr ($12.0 \times 10^{-4}$ Pa) or less.

The vapor deposition rate is not limited as long as the effects of the present invention are not seriously impaired. The vapor deposition rate is, usually, preferably 0.1 Å/sec or more and is more preferably 5.0 Å/sec or less. The film deposition temperature during vapor deposition is not limited as long as the effects of the present invention are not seriously impaired. The film deposition temperature during vapor deposition is performed preferably at 10° C. or more and is preferably at 50° C. or less.

[Hole Transport Layer]

The hole transport layer 4 is a layer for transporting a hole to the luminescent layer 5 from the anode 2. The hole transport layer 4 is not a layer essential for the organic electroluminescence element of the present invention, but in the case of providing a hole transport layer 4, the hole transport layer 4 can be formed on the hole injection layer 3 in the case of having a hole injection layer 3 and can be formed on the anode 2 in the case of not having a hole injection layer 3.

The method for forming the hole transport layer 4 may be a vacuum deposition method or a wet film formation method and is not particularly limited. From the standpoint of reducing the dark spot, the hole transport layer 4 is preferably formed by a wet film formation method and is more preferably formed by a wet film formation of the above-described composition of the present invention.

In the formation of the hole transport layer 4, a composition obtained after a solution containing the later-described material for forming the hole transport layer 4 and a solvent is filtered and then 8 hours or more elapses, is preferably used for the wet film formation. More preferably, a composition obtained after a solution containing a low molecular material constituting the hole transport layer 4 and a solvent is filtered and then 8 hours or more elapses, is used for wet film formation in the formation of the hole transport layer 4.

The material for forming the hole transport layer 4 (in the case of forming the hole transport layer 4 by a wet film formation of the composition of the present invention, the material corresponds to the above-described "organic electroluminescence element material") is preferably a material having high hole transportability and being capable of efficiently transporting an injected hole.

On this account, the material for forming the hole transport layer 4 preferably has small ionization potential, high transparency to visible light, large hole mobility and excellent stability and hardly allows impurities working out to a trap to be produced during production or use.

Also, the hole transport layer 4 which is often put into contact with a luminescent layer 5 preferably causes no quenching of light emitted from the luminescent layer 5 or no formation of an exciplex with the luminescent layer 5 to reduce the efficiency.

The material for such a hole transport layer 4 may be sufficient if it is a material conventionally used as a constituent material of the hole transport layer 4. The material for the hole transport layer 4 includes, for example, those described above as examples of the hole transporting compound used in the hole injection layer 3.

Other examples include an arylamine derivative, a fluorene derivative a Spiro derivative, a carbazole derivative, a pyridine derivative, a pyrazine derivative, a pyrimidine derivative, a triazine derivative, a quinoline derivative, a phenanthroline derivative, a phthalocyanine derivative, a porphyrin derivative, a silole derivative, an oligothiophene derivative, a condensed polycyclic aromatic derivative, and a metal complex.

Furthermore, examples of the material include a polyvinylcarbazole derivative, a polyarylamine derivative, a polyvinyltriphenylamine derivative, a polyfluorene derivative, a polyarylene derivative, a tetraphenylbenzidine-containing polyarylene ether sulfone derivative, a polyarylene vinylene derivative, a polysiloxane derivative, a polythiophene derivative, and a poly(p-phenylenevinylene) derivative.

These may be any one of an alternating copolymer, a random copolymer, a block copolymer and a graft copolymer, and may be also a polymer having a branch in the main chain and having three or more terminal parts, so-called a dendrimer. Among others, the material for the hole transport layer 4 is preferably a polyarylamine derivative or a polyarylene derivative.

The polyarylamine derivative is preferably a polymer containing a repeating unit represented by the following formula (II). In particular, a polymer composed of a repeating unit represented by the following formula (II) is preferred, and in this case, $Ar^a$ or $Ar^b$ may differ among respective repeating units.

[Chem. 18]

(II)

In formula (II), each of $Ar^a$ and $Ar^b$ independently represents an aromatic ring group which may have a substituent.

Examples of the aromatic hydrocarbon group which may have a substituent of $Ar^a$ and $Ar^b$ include a 6-membered monocyclic ring or a 2- to 5-fused ring, each having a free valence of monovalence or divalence, such as benzene ring, naphthalene ring, anthracene ring, phenanthrene ring, perylene ring, tetracene ring, pyrene ring, benzopyrene ring, chrysene ring, triphenylene ring, acenaphthene ring, fluoranthene ring and fluorene ring each having a free valence of monovalence or divalence, and a group formed by connecting two or more of these rings by direct bonding.

Examples of the aromatic heterocyclic group which may have a substituent include a 5- or 6-membered monocyclic ring or a 2- to 4-fused ring, each having a free valence of monovalence or divalence, such as furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perimidine ring, quinazoline ring, quinazolinone ring and azulene ring each having a free valence of monovalence or divalence, and a group formed by connecting two or more of these rings by direct bonding.

In view of solubility and heat resistance, each of $Ar^a$ and $Ar^b$ is independently, preferably a ring selected from the group consisting of a benzene ring, a naphthalene ring, an anthracene ring, a phenanthrene ring, a triphenylene ring, a pyrene ring, a thiophene ring, a pyridine ring and a fluorene ring each having a free valence of monovalence or divalence, or a group formed by connecting two or more benzene rings [for example, a biphenyl group (biphenyl group) or a terphenylene group (terphenylene group)].

Above all, a benzene ring (phenyl group), a group formed by connecting two benzene rings (biphenyl group), or a fluorene ring (fluorenyl group), each having a free valence of monovalence, is preferred.

Examples of the substituent which may be substituted on the aromatic ring group of $Ar^a$ and $Ar^b$ include an alkyl group, an alkenyl group, an alkynyl group, an alkoxy group, an aryloxy group, an alkoxycarbonyl group, a dialkylamino group, a diarylamino group, an acyl group, a halogen atom, a haloalkyl group, an alkylthio group, an arylthio group, a silyl group, a siloxy group, a cyano group, and an aromatic ring group.

The polyarylene derivative includes a polymer having, in its repeating unit, an arylene group such as an aromatic ring group which may have a substituent, described as an example of $Ar^a$ or $Ar^b$ in formula (II).

The polyarylene derivative is preferably a polymer having a repeating unit composed of the following formula (V-1) and/or the following formula (V-2):

[Chem. 19]

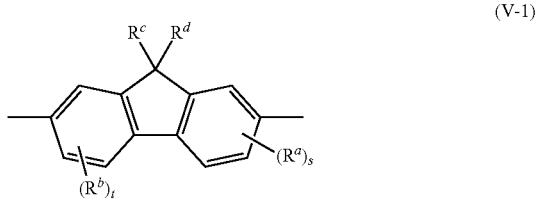

(V-1)

In formula (V-1), each of $R^a$, $R^b$, $R^c$ and $R^d$ independently represents an alkyl group, an alkoxy group, a phenylalkyl group, a phenylalkoxy group, a phenyl group, a phenoxy group, an alkylphenyl group, an alkoxyphenyl group, an alkylcarbonyl group, an alkoxycarbonyl group or a carboxy group. Each of t and s independently represents an integer of 0 to 3. When t or s is 2 or more, the plural $R^a$s or $R^b$s contained per molecule may be the same or different, and adjacent $R^a$s or $R^b$s may form a ring.

[Chem. 20]

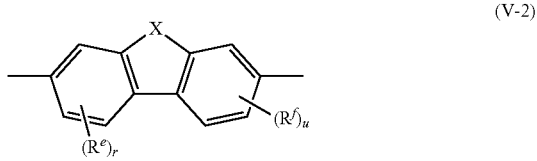

(V-2)

In formula (V-2), each of $R^e$ and $R^f$ independently has the same meaning as $R^a$, $R^b$, $R^c$ and $R^d$ in formula (V-1). Each of r and u independently represents an integer of 0 to 3. When r or u is 2 or more, the plural $R^e$s or $R^f$s contained per molecule may be the same or different, and adjacent $R^e$s or $R^f$s may form a ring. X represents an atom or atomic group constituting a 5-membered ring or a 6-membered ring.

Specific examples of X include —O—, —BR—, —NR—, —SiR$_2$—, —PR—, —SR—, —CR$_2$—, and a group formed by combining these. R represents a hydrogen atom or an arbitrary organic group. The organic group as used in the present invention is a group containing at least one carbon atom.

The polyarylene derivative preferably further has a repeating unit represented by the following formula (V-3), in addition to the repeating unit composed of formula (V-1) and/or formula (V-2):

[Chem. 21]

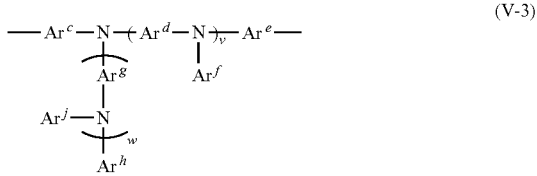

(V-3)

In formula (V-3), each of $Ar^c$ to $Ar^j$ independently represents an aromatic ring group which may have a substituent. Each of v and w independently represents 0 or 1).

Specific examples of $Ar^c$ to $Ar^j$ are the same as those of $Ar^a$ and $Ar^b$ in formula Specific examples of formulae (V-1) to (V-3), specific examples of the polyarylene derivative, and the like include those described in JP-A-2008-98619.

In the case of forming the hole transport layer 4 by a wet film formation method, a hole transport layer-forming composition is prepared, then wet deposited and dried, similarly to the formation of the hole injection layer 3.

The hole transport layer-forming composition contains a solvent (in the case of forming the hole transport layer 4 by a wet film formation of the composition of the present invention, the solvent corresponds to the "solvent" of the organic electroluminescence element composition), in addition to the above-described hole transporting compound. The solvent used is the same as the solvent used for the hole injection layer-forming composition. Furthermore, the film deposition conditions, heating/drying conditions, and the like are the same as those in the formation of the hole injection layer 3.

Also in the case of forming the hole transport layer 4 by a vacuum deposition method, the film deposition conditions and the like are the same as those in the formation of the hole injection layer 3.

The hole transport layer 4 may contain various luminescent materials, electron transporting compounds, binder resins, coatability improvers and the like, in addition to the hole transporting compound.

The hole transport layer 4 may be a layer formed by crosslinking a crosslinkable compound. The crosslinkable compound is a compound having a crosslinkable group and forms a network polymer compound by undergoing crosslinking.

Examples of the crosslinkable group include a cyclic ether such as oxetane and epoxy each having a free valence of monovalence; a group derived from an unsaturated double bond, such as vinyl group, trifluorovinyl group, styryl group, acryl group, methacryloyl and cinnamoyl; and a benzocyclobutane having a free valence of monovalence.

The crosslinkable compound may be any of a monomer, an oligomer and a polymer. Only one crosslinkable compound may be used, or two or more crosslinkable compounds may be used in arbitrary combination at an arbitrary ratio.

As the crosslinkable compound, a hole transporting compound having a crosslinkable group is preferably used. The hole transporting compound includes those described above as examples. The hole transporting compound having a crosslinkable group includes a compound where a crosslinkable group is bonded to the main chain or side chain of the hole transporting compound above. In particular, the crosslinkable group is preferably bonded to the main chain through a linking group such as alkylene group.

In particular, the hole transporting compound is preferably a polymer containing a repeating unit having a crosslinkable group. Above all, the hole transporting compound is preferably a polymer containing a repeating unit where a crosslinkable group is bonded to formula (II) or formula (V-1) to (V-3) directly or through a linking group.

As the crosslinkable compound, a hole transporting compound having a crosslinkable group is preferably used.

Examples of the hole transporting compound include a nitrogen-containing aromatic compound derivative such as pyridine derivative, pyrazine derivative, pyrimidine derivative, triazine derivative, quinoline derivative, phenanthroline derivative, carbazole derivative, phthalocyanine derivative and porphyrin derivative; a triphenylamine derivative; a silole derivative; an oligothiophene derivative; a condensed polycyclic aromatic derivative; and a metal complex.

Among these hole transporting compounds, a nitrogen-containing aromatic derivative such as pyridine derivative, pyrazine derivative, pyrimidine derivative, triazine derivative, quinoline derivative, phenanthroline derivative and carbazole derivative, a triphenylamine derivative, a silole derivative, a condensed polycyclic aromatic derivative, and a metal complex are preferred, and a triphenylamine derivative is more preferred.

For forming the hole transport layer 4 by crosslinking a crosslinkable compound, usually, a hole transport layer-forming composition is prepared by dissolving or dispersing a crosslinkable compound in a solvent, and the composition is deposited as a film by wet film formation and then crosslinked.

The hole transport layer-forming composition may contain an additive for accelerating the crosslinking reaction, other than the crosslinkable compound. Examples of the additive for accelerating the crosslinking reaction include a polymerization initiator and a polymerization accelerator, such as alkylphenone compound, acylphosphine oxide compound, metallocene compound, oxime ester compound, azo compound and onium salt; and a photosensitizer such as condensed polycyclic hydrocarbon, porphyrin compound and diaryl ketone compound.

Also, the hole transport layer-forming composition may contain a coatability improver such as leveling agent and defoaming agent; an electron-accepting compound; a binder resin; and the like.

The hole transport layer-forming composition contains the crosslinkable compound usually in an amount of preferably 0.01 wt % or more, more preferably 0.05 wt % or more, still more preferably 0.1 wt % or more. Also, the hole transport layer-forming composition contains the crosslinkable compound usually in an amount of preferably 50 wt % or less, more preferably 20 wt % or less, still more preferably 10 wt % or less.

The network polymer compound is, usually, preferably formed by depositing a hole transport layer-forming composition containing a crosslinkable compound in such a concentration on the underlying layer (usually, the hole injection layer 3) and then, crosslinking the crosslinkable compound under heating and/or by irradiation with active energy such as light.

The conditions such as temperature and humidity at the film deposition are the same as those at the wet film formation of the hole injection layer. The method for heating after film deposition is not particularly limited. The heating temperature condition is, usually, preferably 120° C. or more and is more preferably 400° C. or less.

The heating time is, usually, preferably 1 minute or more and is more preferably 24 hours or less. The heating method is not particularly limited. As the heating method, for example, a method of placing the laminate having the deposited layer on a hot plate or heating it in an oven is employed. Specifically, for example, conditions such as heating on a hot plate at 120° C. or more for 1 minute or more may be employed for the heating method.

In the case of crosslinking the compound by the irradiation with active energy such as light, examples of the method for active energy irradiation include a direct irradiation method using an ultraviolet, visible or infrared light source such as ultrahigh pressure mercury lamp, high pressure mercury lamp, halogen lamp and infrared lamp, and an irradiation method using a mask aligner having incorporated thereinto the light source described above or using a conveyor-type light irradiation apparatus.

The method for irradiation with active energy other than light includes, for example, irradiation using an apparatus capable of irradiating the film with a microwave generated by a magnetron, that is, a so-called microwave oven. As for the irradiation time, a condition necessary to reduce the solubility of the film is preferably set, but the irradiation time is, usually, preferably 0.1 seconds or more and is more preferably 10 hours or less.

Heating and irradiation with active energy such as light may be performed by using respective methods and conditions individually or in combination. In the case of combining these, the order of practicing them is not particularly limited.

The film thickness of the thus-formed hole transport layer 4 is, usually, preferably 5 nm or more, more preferably 10 nm or more, and is, usually, preferably 300 nm or less, more preferably 100 nm or less.

[Luminescent Layer]

The luminescent layer 5 is a layer working out to a main luminous source by being excited when a hole injected from the anode 2 and an electron injected from the cathode 9 are recombined between electrodes to which an electric field is applied. The luminescent layer 5 can be usually provided on the hole transport layer 4 when a hole transport layer 4 is present, on the hole injection layer 3 when a hole transport layer 4 is not provided and a hole injection layer 3 is present, or on the anode 2 when neither a hole transport layer 4 nor a hole injection layer 3 is provided.

The method for forming the luminescent layer 5 according to the present invention may be either a vacuum deposition method or a wet film formation method and is not particularly limited. The luminescent layer 5 is preferably formed by a wet film formation method and is more preferably formed by a wet film formation of the above-described composition of the present invention.

In the case of forming the luminescent layer 5 by a wet film formation of the composition of the present invention, the luminescent layer-forming composition contains a luminescent layer material (corresponding to the above-described "organic electroluminescence element material") such as luminescent material, and a solvent (corresponding to the above-described "solvent" of the organic electroluminescence element composition).

{Luminescent Layer Material}

The luminescent layer 5 contains, as its constituent material, at least a material having luminescent property (luminescent material) and at the same time, preferably contains a compound having a hole transporting property (hole transporting compound) or a compound having an electron transporting property (electron transporting compound). It is also possible to use a luminescent material as the dopant material and use a hole transporting compound, an electron transporting compound or the like as the host material.

The luminescent material is not particularly limited, and a substance emitting light at a desired emission wavelength and giving good luminous efficiency may be used. Furthermore, the luminescent layer 5 may contain other components as long as the effects of the present invention are not seriously impaired. Incidentally, in the case of forming the luminescent layer 5 by a wet film formation method, a material having a low molecular weight is preferably used for all components.

<Luminescent Material>

As the luminescent material, an arbitrary known material can be applied. The luminescent material may be a fluorescent material or a phosphorescent material. In view of inner quantum efficiency, the luminescent material is preferably a phosphorescent material. Also, a combination of luminescent materials may be, for example, while using a fluorescent material for blue, a phosphorescent material may be used for green and red.

Also, in view of excellent solubility in a solvent, a luminescent material reduced in the molecular symmetry or rigidity, or a luminescent material having introduced thereinto a lipophilic substituent such as alkyl group, is preferably used.

Out of luminescent materials, examples of the fluorescent material and the phosphorescent material include fluorescent materials and phosphorescent materials described in [1] Process of producing Composition for Organic Electroluminescence Element.

An one of these luminescent materials may be used alone, or two or more thereof may be used in arbitrary combination at an arbitrary ratio.

The proportion of the luminescent material in the luminescent layer is arbitrary as long as the effects of the present invention are not seriously impaired. The proportion of the luminescent material is preferably large in terms of the fact that luminance unevenness is less likely to occur, but on the other hand, the proportion is preferably small in view of excellent luminous efficiency.

On this account, the proportion of the luminescent material in the luminescent layer is, usually, preferably 0.05 wt % or more and is preferably 35 wt % or less. In the case of using two or more luminescent materials in combination, the total content of these luminescent materials is preferably set to fall in the range above.

<Hole Transporting Compound>

The luminescent layer 5 may contain a hole transporting compound as its constituent material. Here, out of hole transporting compounds, the hole transporting compound having a low molecular weight includes, for example, hole transporting compounds described in [1] Process of producing Composition for Organic Electroluminescence Element.

In the luminescent layer 5, as the hole transporting compound, only one compound may be used, or two or more compounds may be used in arbitrary combination at an arbitrary ratio.

The proportion of the hole transporting compound in the luminescent layer 5 is arbitrary as long as the effects of the present invention are not seriously impaired. The proportion of the hole transporting compound is preferably large in terms of the fact that the layer is less likely to be affected by a short circuit, and, on the other hand, the proportion is preferably small from the standpoint that thickness unevenness hardly occurs.

Specifically, the proportion of the hole transporting compound in the luminescent layer 5 is, usually, preferably 0.1 wt % or more and is preferably 65 wt % or less. In the case of using two or more kinds of hole transporting compounds in combination, the total content thereof is preferably set to fall in the range above.

<Electron Transporting Compound>

The luminescent layer 5 may contain an electron transporting compound as its constituent material. Here, out of electron transporting compounds, examples of the electron transporting compound having a low molecular weight include electron transporting compounds having a low molecular weight described in [1] Process of producing Composition for Organic Electroluminescence Element.

In the luminescent layer 5, as the electron transporting compound, only one compound may be used, or two or more compounds may be used in arbitrary combination at an arbitrary ratio.

The proportion of the electron transporting compound in the luminescent layer 5 is arbitrary as long as the effects of the present invention are not seriously impaired. The proportion of the electron transporting compound is preferably large in terms of the fact that the layer is less likely to be affected by a short circuit, and, on the other hand, the proportion is preferably small from the standpoint that thickness unevenness hardly occurs. Specifically, the proportion of the electron transporting compound in the luminescent layer 5 is, usually, preferably 0.1 wt % or more and is preferably 65 wt % or less. In the case of using two or more kinds of electron transporting compounds in combination, the total content thereof is preferably set to fall in the range above.

{Formation of Luminescent Layer}

In the case of forming the luminescent layer 5 by a wet film formation method according to the present invention, usually, a luminescent layer-forming composition is prepared by dissolving the above-described materials in an appropriate solvent. Above all, in the formation of the luminescent layer 5, a composition obtained after a solution containing the above-described luminescent layer material and a solvent is filtered and then 8 hours or more elapses, is preferably used for wet film formation.

As the luminescent layer solvent contained in the luminescent layer-forming composition for forming the luminescent layer 5 by a wet film formation method according to the present invention, an arbitrary solvent can be used as long as a luminescent layer can be formed. Suitable examples of the luminescent layer solvent include those described as examples of the solvent in the luminescent layer-forming composition used for forming an organic layer by a wet film formation method in [1] Process of producing Composition for Organic Electroluminescence Element.

The ratio of the luminescent layer solvent to the luminescent layer-forming composition for forming the luminescent layer is arbitrary long as the effects of the present invention are not seriously impaired. The ratio of the luminescent layer solvent to the luminescent layer-forming composition is, as described above, preferably 10 parts by weight or more, more preferably 50 parts by weight or more, still more preferably 80 parts by weight or more, and is preferably 99.95 parts by weight or less, more preferably 99.9 parts by weight or less, still more preferably 99.8 parts by weight or less, per 100 parts by weight of the luminescent layer-forming composition. In the case of using a mixture of two or more solvents as the luminescent layer solvent, the total amount of these solvents is preferably set to fall in the range above.

The total content (solid content concentration) of the luminescent material, hole transporting compound, electron transporting compound and the like in the luminescent layer-forming composition is preferably small in terms of the fact that film thickness unevenness hardly occurs, and, on the other hand, the total concentration is preferably large from the standpoint that a defect is less likely to be produced in the film. On this account, specifically, the solid content concentration is, usually, preferably 0.01 wt % or more and is preferably 70 wt % or less.

After wet film formation of the luminescent layer-forming composition, the obtained coating film is dried to remove the solvent, whereby the luminescent layer 5 is formed. Specifically, this wet film formation method is the same as the method described above for the formation of the hole injection layer 3. The wet film formation method is not limited in its system, and any of the above-described systems may be used as long as the effects of the present invention are not seriously impaired.

The film thickness of the luminescent layer 5 is arbitrary as long as the effects of the present invention are not seriously impaired. The film thickness of the luminescent layer 5 is preferably large in terms of the fact that a defect is less likely to be produced in the film, but the film thickness is preferably small from the standpoint that a low driving voltage is easily attained. Specifically, the film thickness of the luminescent layer 5 is, usually, preferably 3 nm or more, more preferably 5 nm or more, and is, usually, preferably 200 nm or less, more preferably 100 nm or less.

[Hole Blocking Layer]

A hole blocking layer 6 may be provided between the luminescent layer 5 and the later-described electron injection layer 8. The hole blocking layer 6 is a layer stacked on the luminescent layer 5 to come into contact with the interface on the cathode 9 side of the luminescent layer 5.

The hole blocking layer 6 has a role of blocking a hole moving from the anode 2 to reach the cathode 9 and a role of efficiently transporting an electron injected from the cathode 9 toward the luminescent layer 5.

Physical properties required of the material constituting the hole blocking layer 6 include, for example, high electron mobility, low hole mobility, large energy gap (difference between HOMO and LUMO), and high triplet excited level (T1).

Examples of the hole blocking layer 6 material satisfying these conditions include a mixed ligand complex such as bis(2-methyl-8-quinolinolato)(phenolato)aluminum and bis (2-methyl-8-quinolinolato)(triphenylsilanolato)aluminum, a metal complex such as bis(2-methyl-8-quinolate)aluminum-μ-oxo-bis-(2-methyl-8-quinolilato)aluminum binuclear metal complex, a styryl compound such as distyrylbiphenyl derivative (JP-A-11-242996), a triazole derivative such as 3-(4-biphenylyl)-4-phenyl-5(4-tert-butylphenyl)-1,2,4-triazole (JP-A-7-41759), and a phenanthroline derivative such as bathocuproine (JP-A-10-79297). Furthermore, a compound having at least one pyridine ring substituted at 2-, 4- and 6-positions described in International Publication No. 2005-022962 is also preferred as the material of the hole blocking layer 6.

As the material of the hole blocking layer 6, only one material may be used, or two or more materials may be used in arbitrary combination at an arbitrary ratio.

The method for forming the hole blocking layer 6 is not limited. Accordingly, the hole blocking layer 6 can be formed by a wet film formation method, a vapor deposition method or other methods. In the case of forming the hole blocking layer 6 by a wet film formation method, above all, a composition obtained after a solution containing the material constituting the hole blocking layer 6 and a solvent is filtered and then 8 hours or more elapses, is preferably used for wet film formation.

The film thickness of the hole blocking layer 6 is arbitrary as long as the effects of the present invention are not seriously impaired. The film thickness of the hole blocking layer 6 is, usually, preferably 0.3 nm or more, more preferably 0.5 nm or more, and is, usually, preferably 100 nm or less, more preferably 50 nm or less.

[Electron Transport Layer]

An electron transport layer 7 may be provided between the luminescent layer 5 and the later-described electron cathode 9. The electron transport layer 7 is provided on the later-described electron injection layer 8 in the case of providing the electron transport layer 7 and the electron injection layer 8, and is provided on the cathode 9 in the case of not providing the electron injection layer 8.

The electron transport layer 7 is a layer provided for the purpose of more enhancing the luminous efficiency of the element. The electron transport layer 7 is formed of a compound capable of efficiently transporting an electron injected from the cathode 9 toward the luminescent layer 5 between electrodes to which an electric field is applied.

As the electron transporting compound used for the electron transport layer 7, a compound having high a electron injection efficiency from the cathode 9 or the electron injection layer 8 and high electron mobility and being capable of efficiently transporting the injected electron is usually used.

Examples of the compound satisfying these conditions include a metal complex such as aluminum complex of 8-hydroxyquinoline (JP-A-59-194393), a metal complex of 10-hydroxybenzo[h]quinoline, an oxadiazole derivative, a distyrylbiphenyl derivative, a silole derivative, a 3-hydroxyflavone metal complex, a 5-hydroxyflavone metal complex, a benzoxazole metal complex, a benzothiazole metal complex, trisbenzimidazolylbenzene (U.S. Pat. No. 5,645,948), a quinoxaline compound (JP-A-6-207169), a phenanthroline derivative (JP-A-5-331459), 2-tert-butyl-9,10-N,N'-dicyanoanthraquinonediimine, n-type hydrogenated amorphous silicon carbide, n-type zinc sulfide, and n-type zinc selenide.

As the material of the electron transport layer 7, only one material may be used, or two or more materials may be used in arbitrary combination at an arbitrary ratio.

The method for forming the electron transport layer 7 is not limited. Accordingly, the electron transport layer 7 can be formed by a wet film formation method, a vapor deposition method or other methods. In the case of forming the hole transport layer 7 by a wet film formation method, a composition obtained after a solution containing the material constituting the hole blocking layer 7 and a solvent is filtered and then 8 hours or more elapses, is preferably used for wet film formation.

Also, in the formation of the electron transport layer 7, above all, a composition obtained by filtering a solution containing a low-molecular organic material constituting the electron transport layer 7 and a solvent and leaving the solution to pass 8 hours or more is preferably used for wet film formation.

The film thickness of the electron transport layer 7 is arbitrary as long as the effects of the present invention are not seriously impaired. The film thickness of the electron transport layer 7 is, usually, preferably 1 nm or more, more preferably 5 nm or more, and is, usually, preferably 300 nm or less, more preferably 100 nm or less.

[Electron Injection Layer]

An electron injection layer 8 may be provided between the luminescent layer 5 and the later-described cathode 9. In the case of providing an electron injection layer 8, the electron injection layer 8 is usually provided below the cathode 9.

The electron injection layer 8 fulfills the role of efficiently injecting an electron injected from the cathode 9, into the luminescent layer 5. In order to efficiently perform the electron injection, the material for forming the electron injection layer 8 is preferably a metal having a low work function. Examples thereof include an alkali metal such as sodium and cesium, and an alkaline earth metal such as barium and calcium. The film thickness of the electron injection layer 8 is, usually, preferably 0.1 nm or more and is preferably 5 nm or less.

In the electron injection layer 8, an organic electron transport compound typified by a nitrogen-containing heterocyclic compound such as bathophenanthroline and a metal complex such as aluminum complex of 8-hydroxyquinoline is preferably doped with an alkali metal such as sodium, potassium, cesium, lithium and rubidium (described, for example, in JP-A-10-270171, JP-A-2002-100478 and JP-A-2002-100482), because both enhanced electron injection/transport performance and excellent film quality can be achieved. In this case, the film thickness of the electron injection layer 8 is, usually, preferably 5 nm or more, more preferably 10 nm or more, and is, usually, preferably 200 nm or less, more preferably 100 nm or less.

As the material of the electron injection layer 8, only one material may be used, or two or more materials may be used in arbitrary combination at an arbitrary ratio.

The method for forming the electron injection layer 8 is not limited. Accordingly, the electron injection layer 8 can be formed by a wet film formation method, a vapor deposition method or other methods. In the case of forming the hole injection layer 8 by a wet film formation method, above all, a composition obtained after a solution containing the material constituting the hole injection layer 8 and a solvent is filtered and then 8 hours or more elapses is preferably used for wet film formation.

Also, in the formation of the electron injection layer 8, a composition obtained by filtering a solution containing a low-molecular organic material constituting the electron injection layer 8 and a solvent and leaving the solution to pass 8 hours or more is more preferably used for wet film formation.

[Cathode]

The cathode 9 fulfills the role of injecting an electron into a layer (for example, the electron injection layer 8 or the luminescent layer 5) on the luminescent layer 5 side.

As the material of the cathode 9, materials used for the anode 2 may be used. In order to efficiently perform the electron injection, the material of the cathode 9 is preferably a metal having a low work function and, for example, an appropriate metal such as tin, magnesium, indium, calcium, aluminum and silver, or an alloy thereof is used. Specific examples thereof include an alloy electrode having a low work function, such as magnesium-silver alloy, magnesium-indium alloy and aluminum-lithium alloy.

As the material of the cathode 9, only one material may be used, or two or more materials may be used in arbitrary combination at an arbitrary ratio.

The film thickness of the cathode 9 is usually the same as that of the anode 2.

For the purpose of protecting the cathode 9 composed of a metal having a low work function, a metal layer having a high work function and being stable to the air is preferably further stacked thereon, because the stability of the element is increased. For example, a metal such as aluminum, silver, copper, nickel, chromium, gold and platinum is used for this purpose. As such a material, only one material may be used, or two or more materials may be used in arbitrary combination at an arbitrary ratio.

[Other Layers]

The organic electroluminescence element according to the present invention may have a different configuration without departing from the scope of the present invention. For example, the organic electroluminescence element may have an optional layer between the anode 2 and the cathode 9 in addition to the layers described above, as long as the performance thereof is not impaired. Also, a layer described above may be omitted.

The layer which may be provided other than the layers described above includes, for example, an electron blocking layer.

In the case of providing an electron blocking layer, the layer is usually provided between the hole injection layer 3 or hole transport layer 4 and the luminescent layer 5. The electron blocking layer has a role of blocking an electron moving from the luminescent layer 5 to reach the hole injection layer 3, thereby increasing the probability of recombination of a hole and an electron in the luminescent layer 5 and confining the produced exciton in the luminescent layer 5, and a role of efficiently transporting a hole injected from the hole injection layer 3 toward the luminescent layer 5. In particular, when a phosphorescent material or a blue luminescent material is used as the luminescent material, it is effective to provide an electron blocking layer.

The characteristics required of the electron blocking layer include, for example, high hole transportability, large energy gap (difference between HOMO and LUMO), and high triplet excited level (T1).

Furthermore, in the present invention, when the luminescent layer 5 is produced as the organic layer according to the present invention by a wet film formation method, the electron blocking layer is also required to have wet film formation adaptability. Examples of the material used for such an electron blocking layer include a copolymer of dioctylfluorene and triphenylamine, typified by F8-TFB (International Publication No. 2004/084260).

As the material of the electron blocking layer, only one material may be used, or two or more materials may be used in arbitrary combination at an arbitrary ratio.

The method for forming the electron blocking layer is not limited. Accordingly, the electron blocking layer can be formed by a wet film formation method, a vapor deposition method or other methods.

It is also an effective method for enhancing the element efficiency to provide, for example, an ultrathin insulating film (from 0.1 to 5 nm) formed of lithium fluoride (LiF), magnesium fluoride ($MgF_2$), lithium oxide ($Li_2O$), cesium(II) carbonate ($CsCO_3$) or the like at the interface between the cathode 9 and the luminescent layer 5 or electron transport layer 7 (see, for example, *Applied Physics Letters*, Vol. 70, page 152 (1997); JP-A-10-74586; *IEEE Transactions on Electron Devices*, Vol. 44, page 1245 (1997); and *SID 04 Digest*, page 154).

Furthermore, in the layer configuration described above, the constituent elements except for the substrate may be stacked in reverse order. For example, in the layer configuration of FIG. 1, constituent elements may be provided on the substrate 1 in order of a cathode 9, an electron injection layer 8, an electron transport layer 7, a hole blocking layer 6, a luminescent layer 5, a hole transport layer 4, a hole injection layer 3 and an anode 2.

In addition, the organic electroluminescence element according to the present invention can be also configured by stacking constituent elements except for the substrate between two substrates with at least one substrate having transparency.

A structure where constituent elements (luminescent unit) except for the substrate are layered in plural tiers (a structure where plural luminescent units are stacked) may be also employed. In this case, when a carrier generation layer (CGL) composed of, for example, vanadium pentoxide ($V_2O_5$) is provided in place of interface layers (when the anode is ITO and the cathode is Al, these two layers) between respective tiers (between luminescent units), the barrier between tiers is reduced and this more preferred in view of luminous efficiency and driving voltage.

Also, the organic electroluminescence element according to the present invention may be configured as a single organic electroluminescence element, may be applied to a configuration where plural organic electroluminescence elements are arranged in an array manner, or may be applied to a configuration where the anode and the cathode are arranged in an X—Y matrix manner.

In each of the above-described layers, components other than those described as the material may be contained as long as the effects of the present invention are not seriously impaired.

[5] Organic EL Display Device

The organic EL display device of the present invention has the above-described organic electroluminescence element of the present invention. The organic EL display device of the present invention is not particularly limited in its mode or structure and can be fabricated according to a conventional method by using the organic electroluminescence element of the present invention.

For example, the organic EL display device of the present invention can be fabricated by such a method as described in Seishi Tokito, Chihaya Adachi and Hideyuki Murata, *Yuki EL Display* (*Organic EL Display*), Ohm-Sha (Aug. 20, 2004).

[6] Organic EL Lighting

The organic EL lighting of the present invention has the above-described organic electroluminescence element of the present invention. The organic EL lighting of the present invention is not particularly limited in its mode or structure and can be fabricated according to a conventional method by using the organic electroluminescence element of the present invention.

EXAMPLES

The present invention is described in greater detail below by referring to Examples, but the present invention is not limited to the following Examples as long as the gist of the present invention is observed.

Manufacturing of Element for Characteristic Evaluation

Example 1

An organic electroluminescence element shown in FIG. 1 was manufactured. First, a substrate 1 (sputtering deposition product, produced by Sanyo Vacuum Industries Co., Ltd.) where an ITO transparent electrically conductive film is deposited on a glass substrate to a thickness of 150 nm and patterned with 2 mm-wide stripes to form an anode 2 of an ITO layer, was cleaned by, in order, ultrasonic cleaning with an aqueous surfactant solution, washing with ultrapure water, ultrasonic cleaning with ultrapure water, and washing with ultrapure water, then dried with compressed air, and finally subjected to ultraviolet/ozone cleaning.

Next, an ethyl benzoate solution (hole injection layer-forming composition) containing 2.0 wt % of a hole transporting polymer compound having a repeating structure represented by the following (P1) and 0.8 wt % of 4-isopropyl-4'-methyldiphenyliodonium tetrakis(pentafluorophenyl)borate represented by the following (A1) was prepared.

[Chem. 22]

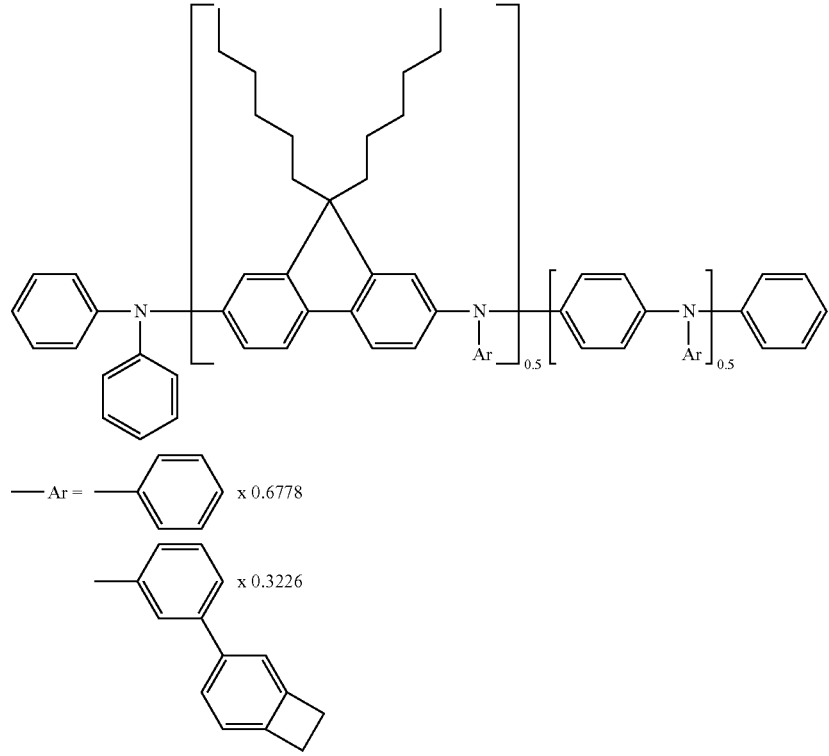

(P1)

-continued (A1)

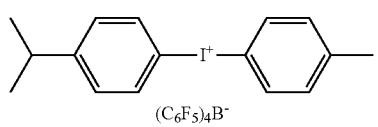

The obtained hole injection layer-forming composition was deposited on the ITO substrate above under the following deposition conditions and then baked under the following baking conditions to obtain a hole injection layer 3 having a film thickness of 42 nm.
<Deposition Conditions>
Spinner rotation speed: 1,500 rpm
Spinner rotation time: 30 seconds
Spin coating atmosphere: air atmosphere Baking conditions: air atmosphere, 230° C. and 1 hour Thereafter, a 1 wt % cyclohexylbenzene solution (hole transport layer-forming composition) of a hole transporting polymer compound represented by the following (H1) was prepared, and this solution was deposited on the hole injection layer 3 by spin coating under the following deposition conditions and then subjected to a crosslinking treatment by baking to form a hole transport layer 4 having a film thickness of 15 nm.

(H1)

[Chem. 23]

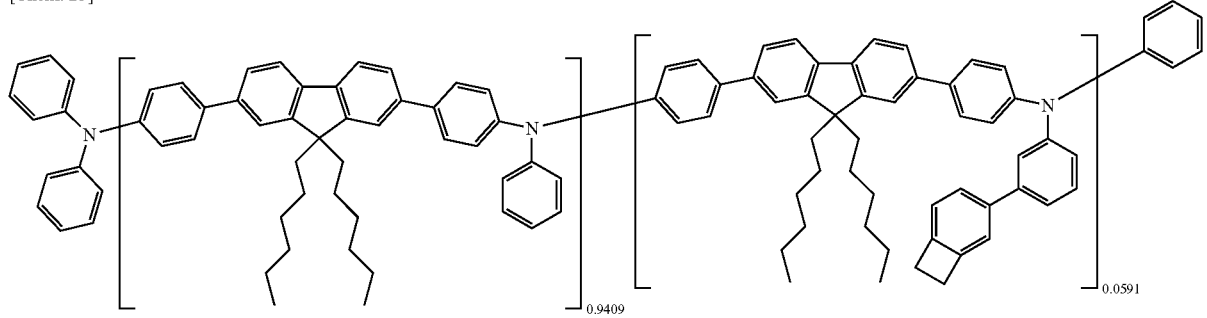

<Deposition Conditions>
Spinner rotation speed: 1,500 rpm
Spinner rotation time: 120 seconds
Spin coating atmosphere: nitrogen atmosphere
Baking conditions: nitrogen atmosphere, 230° C. and 1 hour In forming a luminescent layer 5, a luminescent layer-forming composition according to the following formulation was prepared using Luminescent Materials (C6) and (C7) and Charge Transport Materials (C1) and (C2), which are shown below.

[Chem. 24]

(C1)

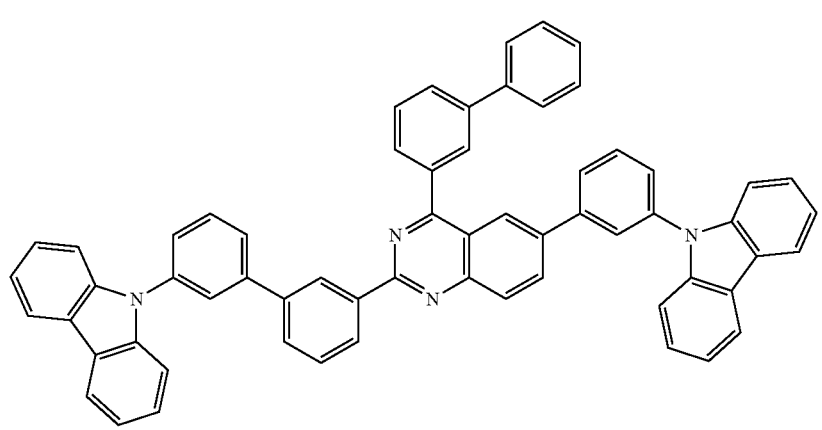

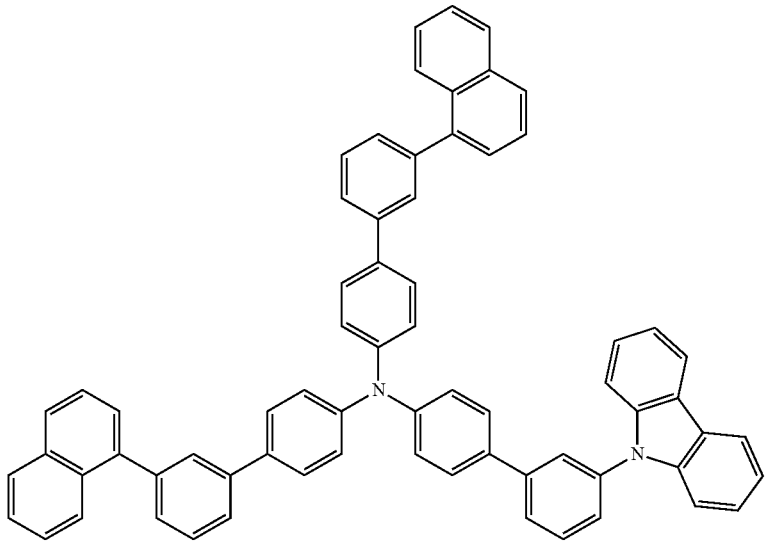
(C2)

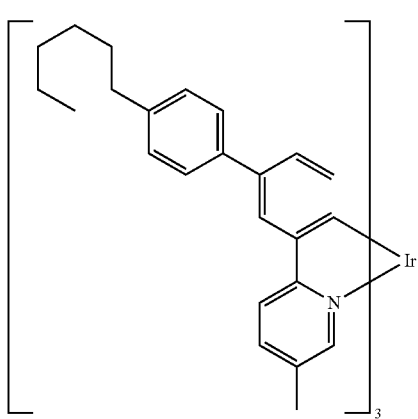
(C6)

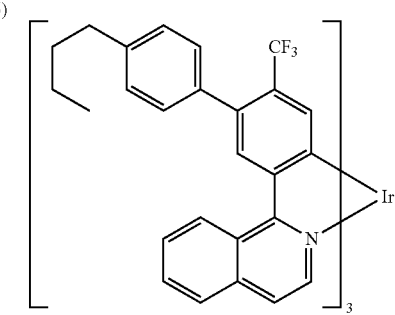
(C7)

<Formulation of Luminescent Layer-Forming Composition>
Solvent: cyclohexylbenzene
Component concentration:
C1: 1.25 wt %
C2: 3.75 wt %
C6: 0.25 wt %
C7: 0.35 wt %

The obtained luminescent layer-forming composition was filtered through a membrane filter having a pore size of 0.2 μm (manufactured by GE Healthcare) and after putting it in a brown bottle container and at the same time, filling the inside of the bottle with an $N_2$ gas, the composition was left to pass 12 hours in an air atmosphere (atmospheric pressure) at a temperature of 18 to 25° C. and a relative humidity of 30 to 60%.

The luminescent layer-forming composition left to pass 12 hours was extracted with a micropipette and spin-coated on the hole transport layer 4 under the following conditions to form a luminescent layer 5 having a film thickness of 58 nm. Incidentally, the "to pass 12 hours" as used herein means a time from filtration of the luminescent layer-forming composition to start of sucking by the micropipette.

<Deposition Conditions>
Spinner rotation speed: 2,000 rpm
Spinner rotation time: 120 seconds
Spin coating atmosphere: nitrogen atmosphere
Baking conditions: nitrogen atmosphere, 130° C. and 10 minutes The substrate after wet depositing the hole injection layer 3, the hole transport layer 4 and the luminescent layer 5 thereon was introduced into a vacuum deposition apparatus, and rough evacuation was performed. Thereafter, the apparatus was evacuated with a cryopump until the degree of vacuum in the apparatus reached $3.0\times10^{-4}$ Pa or less, and a composition represented by the following structural formula (C9) was deposited on the luminescent layer 5 by a vacuum deposition method to obtain a hole blocking layer 6 having a film thickness of 10 nm. Here, the degree of vacuum during film deposition was kept at $2.2\times10^{-4}$ Pa or less, and the deposition rate was controlled in a range of 0.6 to 1.2 Å/sec.

[Chem. 25]

(C9)

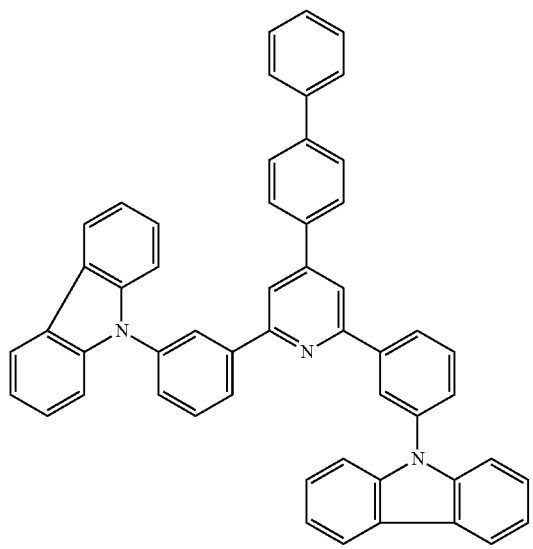

Furthermore, tris(8-hydroxyquinolinato)aluminum was heated and thereby deposited on the hole blocking layer 6 to form an electron transport layer 7 having a film thickness of 20 nm. Here, the degree of vacuum during film deposition was kept at $2.2 \times 10^{-4}$ Pa or less, and the deposition rate was controlled in a range of 0.7 to 1.3 Å/sec.

The substrate having deposited thereon up to the electron transport layer 7 was transferred to a metal deposition chamber from the organic layer deposition chamber in which layer up to the electron transport layer 7 were deposited. On the substrate after deposition up to the electron transport layer 7, a shadow mask with 2 mm-wide stripes was placed as a mask for cathode deposition to make tight contact by arranging the stripes to cross the ITO stripes of the anode 2 at right angles, and the chamber was evacuated until the degree of vacuum in the apparatus reached $1.1 \times 10^{-4}$ Pa or less, similarly to the organic layer deposition.

In a state of the degree of vacuum being kept at $1.0 \times 10^{-4}$ or less, lithium fluoride (LiF) was deposited on the electron transport layer 7 to a film thickness of 0.5 nm by using a molybdenum boat while controlling the deposition rate in a range of 0.07 to 0.15 Å/sec, whereby an electron injection layer 8 was formed.

Thereafter, in a state of the degree of vacuum being kept at $2.0 \times 10^{-4}$ Pa, aluminum was deposited to a film thickness of 80 nm in the same manner by heating a molybdenum boat while controlling the deposition rate in a range of 0.6 to 10.0 Å/sec, whereby a cathode 9 was formed. Here, the substrate temperature during deposition of this two-layer cathode was kept at room temperature.

Subsequently, in order to prevent the element from deterioration due to moisture or the like in the air during storage, a sealing treatment was performed by the following method.

In a nitrogen glove box, photocurable resin 30Y-437 (produced by ThreeBond Co., Ltd.) was coated to a width of 1 mm on the outer peripheral part of a glass plate having a size of 23 mm×23 mm, and a moisture getter sheet (produced by Dynic Corp.) was disposed in the central part of the glass plate. The substrate after the completion of formation up to the cathode was introduced thereon and laminated together by arranging the deposition surface to face the desiccant sheet. Thereafter, only the region coated with the photocurable resin was irradiated with ultraviolet light to cure the resin.

In this way, an organic electroluminescence element having a luminescent area portion with a size of 2 mm×2 mm was obtained.

Example 2

An element was manufactured in the same manner as in Example 1 except that at the formation of the luminescent layer 5 in Example 1, a luminescent layer-forming composition prepared according to the following formulation by using Luminescent Material (C6) and Charge Transport Materials (C3) and (C4) shown below was used.

[Chem. 26]

(C3)

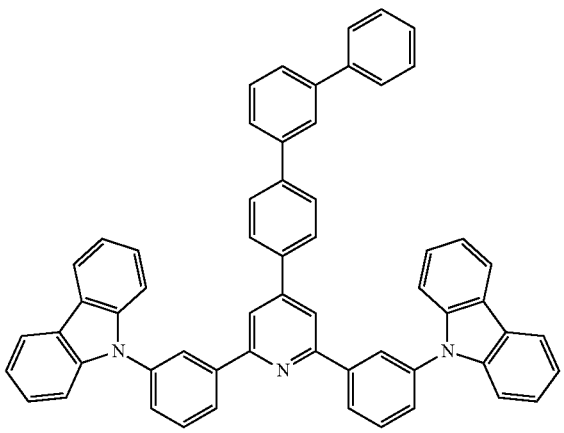

(C4)

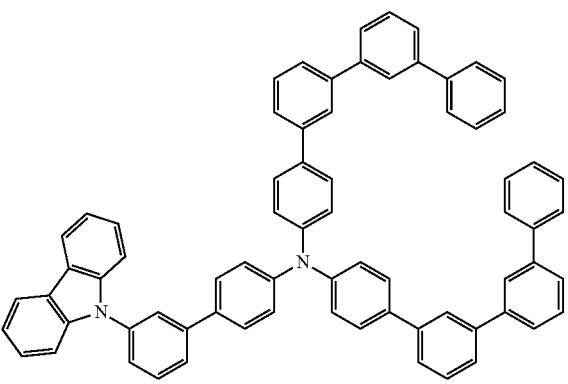

<Formulation of Luminescent Layer-Forming Composition>
Solvent: cyclohexylbenzene
Component concentration:
C3: 1.275 wt %
C4: 3.825 wt %
C6: 0.51 wt %

Example 3

An element was manufactured in the same manner as in Example 1 except that at the formation of the luminescent layer 5 in Example 1, a luminescent layer-forming composition prepared according to the following formulation by using Luminescent Material (C8) shown below and Charge Transport Material (C5) shown below was used, the baking time at the wet film formation was changed to 20 minutes, and a luminescent layer having a film thickness of 50 nm was obtained.

[Chem. 27]

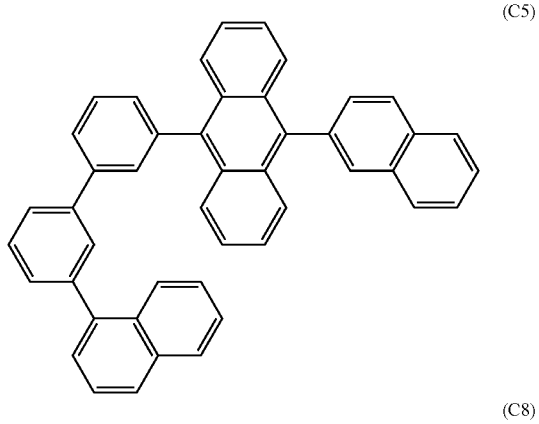

(C5)

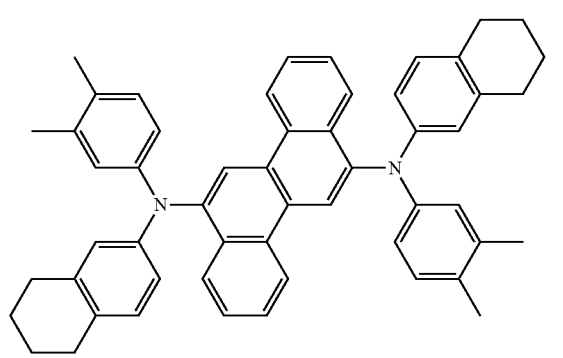

(C8)

<Formulation of Luminescent Layer-Forming Composition>
Solvent: cyclohexylbenzene
Component concentration:
C5: 3.3 wt %
C8: 0.33 wt %

Example 4

An element was manufactured in the same manner as in Example 1 except that in Example 1, the elapsing time after filtration of the luminescent layer-forming composition was changed to 24 hours.

Example 5

An element was manufactured in the same manner as in Example 2 except that in Example 2, the elapsing time after filtration of the luminescent layer-forming composition was changed to 24 hours.

Example 6

An element was manufactured in the same manner as in Example 3 except that in Example 3, the elapsing time after filtration of the luminescent layer-forming composition was changed to 24 hours.

Example 7

An element was manufactured in the same manner as in Example 1 except that in Example 1, the elapsing time after filtration of the luminescent layer-forming composition was changed to 36 hours.

Example 8

An element was manufactured in the same manner as in Example 2 except that in Example 2, the elapsing time after filtration of the luminescent layer-forming composition was changed to 36 hours.

Example 9

An element was manufactured in the same manner as in Example 3 except that in Example 3, the elapsing time after filtration of the luminescent layer-forming composition was changed to 36 hours.

Example 10

An element was manufactured in the same manner as in Example 1 except that in Example 1, the elapsing time after filtration of the luminescent layer-forming composition was changed to 48 hours.

Example 11

An element was manufactured in the same manner as in Example 2 except that in Example 2, the elapsing time after filtration of the luminescent layer-forming composition was changed to 48 hours.

Example 12

An element was manufactured in the same manner as in Example 3 except that in Example 3, the elapsing time after filtration of the luminescent layer-forming composition was changed to 48 hours.

Example 13

An element was manufactured in the same manner as in Example 1 except that in Example 1, the elapsing time after filtration of the luminescent layer-forming composition was changed to 31 days.

Example 14

An element was manufactured in the same manner as in Example 2 except that in Example 2, the elapsing time after filtration of the luminescent layer-forming composition was changed to 31 days.

Example 15

An element was manufactured in the same manner as in Example 3 except that in Example 3, the elapsing time after filtration of the luminescent layer-forming composition was changed to 31 days.

Comparative Example 1

An element was manufactured in the same manner as in Example 1 except that in Example 1, wet film formation was performed (after 10 to 20 minutes) without providing an elapsing period after filtration of the luminescent layer-forming composition.

Comparative Example 2

An element was manufactured in the same manner as in Example 2 except that in Example 2, wet film formation was performed (after 10 to 20 minutes) without providing an elapsing period after filtration of the luminescent layer-forming composition.

Comparative Example 3

An element was manufactured in the same manner as in Example 3 except that in Example 3, wet film formation was performed (after 10 to 20 minutes) without providing an elapsing period after filtration of the luminescent layer-forming composition.

Comparative Example 4

An element was manufactured in the same manner as in Example 1 except that in Example 1, the elapsing time after filtration of the luminescent layer-forming composition was changed to 34 days and filtration was again performed immediately before wet film formation (wet film formation 10 to 20 minutes after the filtration).

Comparative Example 5

An element was manufactured in the same manner as in Example 2 except that in Example 2, the elapsing time after filtration of the luminescent layer-forming composition was changed to 34 days and filtration was again performed immediately before wet film formation (wet film formation 10 to 20 minutes after the filtration).

Comparative Example 6

An element was manufactured in the same manner as in Example 3 except that in Example 3, the elapsing time after filtration of the luminescent layer-forming composition was changed to 31 days and filtration was again performed immediately before wet film formation (wet film formation 10 to 20 minutes after the filtration).

[Evaluation of Element Characteristics]

Each of the organic electroluminescence elements manufactured in Examples 1 to 15 and Comparative Examples 1 to 6 was subjected to a direct-current driving test to examine the initial luminance. Also, the luminance-current efficiency (cd/A) at 1,000 cd/m$^2$ was examined, and the difference from the luminance-current efficiency of Comparative Examples 1 to 3 (hereinafter, referred to as a "luminance-current efficiency difference") was determined. The drive life until the luminance was reduced to 70% from the initial luminance was measured, and assuming that the drive life of Comparative Examples 1 to 3 is 100, its relative value was determined (hereinafter, referred to as a "relative drive life"). The results are shown in Tables 1 to 3.

TABLE 1

|  | Filtration and Time-Elapsing Steps | Presence or Absence of Filter of Nozzle | Luminance-Current Efficiency Difference [cd/A] | Relative Drive Life | Initial Luminance [cd/A] |
|---|---|---|---|---|---|
| Example 1 | (passing of 10 to 20 minutes after filtration) | nozzle without filter | 17.3 | 220 | 5000 |
| Example 4 | passing of 12 hours after filtration | nozzle without filter | 18.2 | 210 | 5000 |
| Example 7 | passing of 24 hours after filtration | nozzle without filter | 10.9 | 220 | 5000 |
| Example 10 | passing of 36 hours after filtration | nozzle without filter | 16.6 | 250 | 5000 |
| Example 13 | passing of 48 hours after filtration | nozzle without filter | 14.6 | 230 | 5000 |
| Comparative Example 1 | passing of 31 days after filtration | nozzle without filter | 0.0 | 100 | 5000 |
| Comparative Example 4 | passing of 34 days after filtration (+passing of 10 to 20 minutes after re-filtration) | nozzle without filter | 3.1 | 60 | 5000 |

*EML host: C1 and C2, EML dopant: C6 and C7.

TABLE 2

|  | Filtration and Time-Elapsing Steps | Presence or Absence of Filter of Nozzle | Luminance-Current Efficiency Difference [cd/A] | Relative Drive Life | Initial Luminance [cd/A] |
|---|---|---|---|---|---|
| Example 2 | (passing of 10 to 20 minutes after filtration) | nozzle without filter | 13.9 | 210 | 8000 |
| Example 5 | passing of 12 hours after filtration | nozzle without filter | 14.1 | 205 | 8000 |
| Example 8 | passing of 24 hours after filtration | nozzle without filter | 19.4 | 180 | 8000 |

TABLE 2-continued

|  | Filtration and Time-Elapsing Steps | Presence or Absence of Filter of Nozzle | Luminance-Current Efficiency Difference [cd/A] | Relative Drive Life | Initial Luminance [cd/A] |
|---|---|---|---|---|---|
| Example 11 | passing of 36 hours after filtration | nozzle without filter | 15.5 | 200 | 8000 |
| Example 14 | passing of 48 hours after filtration | nozzle without filter | 14.0 | 150 | 8000 |
| Comparative Example 2 | passing of 31 days after filtration | nozzle without filter | 0.0 | 100 | 8000 |
| Comparative Example 5 | passing of 34 days after filtration (+passing of 10 to 20 minutes after re-filtration) | nozzle without filter | −4.3 | 100 | 8000 |

*EML host: C3 and C4, EML dopant: C6.

TABLE 3

|  | Filtration and Time-Elapsing Steps | Presence or Absence of Filter of Nozzle | Luminance-Current Efficiency Difference [cd/A] | Relative Drive Life | Initial Luminance [cd/A] |
|---|---|---|---|---|---|
| Example 3 | (passing of 10 to 20 minutes after filtration) | nozzle without filter | 4.9 | 223 | 3000 |
| Example 6 | passing of 12 hours after filtration | nozzle without filter | 7.8 | 231 | 3000 |
| Example 9 | passing of 24 hours after filtration | nozzle without filter | 8.9 | 354 | 3000 |
| Example 12 | passing of 36 hours after filtration | nozzle without filter | 6.8 | 423 | 3000 |
| Example 15 | passing of 48 hours after filtration | nozzle without filter | 4.6 | 223 | 3000 |
| Comparative Example 3 | passing of 31 days after filtration | nozzle without filter | 0.0 | 100 | 3000 |
| Comparative Example 6 | passing of 34 days after filtration (+passing of 10 to 20 minutes after re-filtration) | nozzle without filter | −29.1 | 65 | 3000 |

*EML host: C5, EML dopant: C8.

Example 16

An element was manufactured in the same manner as in Example 1.

Example 17

An element was manufactured in the same manner as in Example 2.

Example 18

An element was manufactured in the same manner as in Example 3 except that in Example 3, the film thickness of the luminescent layer was changed to 40 nm.

Example 19

An element was manufactured in the same manner as in Example 16 except that in Example 16, the elapsing time after filtration of the luminescent layer-forming composition was changed to 24 hours.

Example 20

An element was manufactured in the same manner as in Example 17 except that in Example 17, the elapsing time after filtration of the luminescent layer-forming composition was changed to 24 hours.

Example 21

An element was manufactured in the same manner as in Example 18 except that in Example 18, the elapsing time after filtration of the luminescent layer-forming composition was changed to 24 hours.

Example 22

An element was manufactured in the same manner as in Example 16 except that in Example 16, the elapsing time after filtration of the luminescent layer-forming composition was changed to 48 hours.

Example 23

An element was manufactured in the same manner as in Example 17 except that in Example 17, the elapsing time after filtration of the luminescent layer-forming composition was changed to 48 hours.

Example 24

An element was manufactured in the same manner as in Example 18 except that in Example 18, the elapsing time after filtration of the luminescent layer-forming composition was changed to 48 hours.

Example 25

An element was manufactured in the same manner as in Example 16 except that in Example 16, the elapsing time after filtration of the luminescent layer-forming composition was changed to 7 days.

Example 26

An element was manufactured in the same manner as in Example 17 except that in Example 17, the elapsing time after filtration of the luminescent layer-forming composition was changed to 7 days.

Example 27

An element was manufactured in the same manner as in Example 18 except that in Example 18, the elapsing time after filtration of the luminescent layer-forming composition was changed to 7 days.

Example 28

An element was manufactured in the same manner as in Example 16 except that in Example 16, a luminescent layer-forming composition left to pass 12 hours after extraction by a micropipette was put in a syringe with a membrane filter having a pore size of 0.2 μm (produced by Millipore) and directly dropped on the hole transport layer 4 from the syringe to form a luminescent layer 5 by a spin coating method.

Example 29

An element was manufactured in the same manner as in Example 28 except that in Example 28, a luminescent layer-forming composition prepared according to the formulation shown in Example 2 by using Luminescent Material (C6) and Charge Transport Materials (C3) and (C4) was used at the formation of the luminescent layer 5.

Example 30

An element was manufactured in the same manner as in Example 28 except that in Example 28, at the formation of the luminescent layer 5, a luminescent layer-forming composition prepared according to the formulation shown in Example 3 by using Luminescent Material (C8) shown below and Charge Transport Material (C5) shown below was used, the baking time during wet film formation was changed to 20 minutes, and a luminescent layer having a film thickness of 40 nm was obtained.

Example 31

An element was manufactured in the same manner as in Example 28 except that in Example 28, the elapsing time after filtration of the luminescent layer-forming composition was changed to 24 hours.

Example 32

An element was manufactured in the same manner as in Example 29 except that in Example 29, the elapsing time after filtration of the luminescent layer-forming composition was changed to 24 hours.

Example 33

An element was manufactured in the same manner as in Example 30 except that in Example 30, the elapsing time after filtration of the luminescent layer-forming composition was changed to 24 hours.

Example 34

An element was manufactured in the same manner as in Example 28 except that in Example 28, the elapsing time after filtration of the luminescent layer-forming composition was changed to 48 hours.

Example 35

An element was manufactured in the same manner as in Example 29 except that in Example 29, the elapsing time after filtration of the luminescent layer-forming composition was changed to 48 hours.

Example 36

An element was manufactured in the same manner as in Example 30 except that in Example 30, the elapsing time after filtration of the luminescent layer-forming composition was changed to 48 hours.

Example 37

An element was manufactured in the same manner as in Example 28 except that in Example 28, the elapsing time after filtration of the luminescent layer-forming composition was changed to 7 days.

Example 38

An element was manufactured in the same manner as in Example 29 except that in Example 29, the elapsing time after filtration of the luminescent layer-forming composition was changed to 7 days.

Example 39

An element was manufactured in the same manner as in Example 30 except that in Example 30, the elapsing time after filtration of the luminescent layer-forming composition was changed to 7 days.

Comparative Example 7

An element was manufactured in the same manner as in Example 16 except that in Example 16, wet film formation was performed (after 10 to 20 minutes) without providing an elapsing period after filtration of the luminescent layer-forming composition.

Comparative Example 8

An element was manufactured in the same manner as in Example 17 except that in Example 17, wet film formation was performed (after 10 to 20 minutes) without providing an elapsing period after filtration of the luminescent layer-forming composition.

Comparative Example 9

An element was manufactured in the same manner as in Example 18 except that in Example 18, wet film formation was performed (after 10 to 20 minutes) without providing an elapsing period after filtration of the luminescent layer-forming composition.

Comparative Example 10

An element was manufactured in the same manner as in Example 28 except that in Example 28, wet film formation was performed (after 10 to 20 minutes) without providing an elapsing period after filtration of the luminescent layer-forming composition.

Comparative Example 11

An element was manufactured in the same manner as in Example 29 except that in Example 29, wet film formation was performed (after 10 to 20 minutes) without providing an elapsing period after filtration of the luminescent layer-forming composition.

Comparative Example 12

An element was manufactured in the same manner as in Example 30 except that in Example 30, wet film formation was performed (after 10 to 20 minutes) without providing an elapsing period after filtration of the luminescent layer-forming composition.

Comparative Example 13

An element was manufactured in the same manner as in Example 16 except that in Example 16, after the luminescent layer-forming composition filtered was left to pass 7 days and then again filtered through a membrane filter having a pore size of 0.2 μm (produced by GE Healthcare), wet film formation was performed (after 10 to 20 minutes) without providing an elapsing period.

Comparative Example 14

An element was manufactured in the same manner as in Example 17 except that in Example 17, after the luminescent layer-forming composition filtered was left to pass 7 days and then again filtered through a membrane filter having a pore size of 0.2 μm (produced by GE Healthcare), wet film formation was performed (after 10 to 20 minutes) without providing an elapsing period.

Comparative Example 15

An element was manufactured in the same manner as in Example 18 except that in Example 18, after the luminescent layer-forming composition filtered was left to pass 7 days and then again filtered through a membrane filter having a pore size of 0.2 μm (produced by GE Healthcare), wet film formation was performed (after 10 to 20 minutes) without providing an elapsing period.

Comparative Example 16

An element was manufactured in the same manner as in Example 28 except that in Example 28, after the luminescent layer-forming composition filtered was left to pass 7 days and then again filtered through a membrane filter having a pore size of 0.2 μm (produced by GE Healthcare), wet film formation was performed (after 10 to 20 minutes) without providing an elapsing period.

Comparative Example 17

An element was manufactured in the same manner as in Example 29 except that in Example 29, after the luminescent layer-forming composition filtered was left to pass 7 days and then again filtered through a membrane filter having a pore size of 0.2 μm (produced by GE Healthcare), wet film formation was performed (after 10 to 20 minutes) without providing an elapsing period.

Comparative Example 18

An element was manufactured in the same manner as in Example 30 except that in Example 30, after the luminescent layer-forming composition filtered was left to pass 7 days and then again filtered through a membrane filter having a pore size of 0.2 μm (produced by GE Healthcare), wet film formation was performed (after 10 to 20 minutes) without providing an elapsing period.

[Evaluation of Element Characteristics]

Each of the organic electroluminescence elements manufactured in Examples 16 to 39 and Comparative Examples 7 to 18 was subjected to a direct-current driving test.

The direct-current driving test was performed at an initial luminance of 5,000 cd/m$^2$ for Examples 16, 19, 22, 25, 28, 31, 34 and 37 and Comparative Examples 7, 10, 13 and 16, at an initial luminance of 8,000 cd/m$^2$ for Examples 17, 20, 23, 26, 29, 32, 35 and 38 and Comparative Examples 8, 11, 14 and 17, and at an initial luminance of 3,000 cd/m$^2$ for Examples 18, 21, 24, 27, 30, 33, 36 and 39 and Comparative Examples 9, 12, 15 and 18.

With respect to luminance after 48 hours of Examples 16 to 39 and Comparative Examples 13 to 18, the percentage change from that of Comparative Examples 7 to 12 was calculated. The results are shown in Tables 4 to 6.

TABLE 4

| | Filtration and Time-Elapsing Steps | Presence or Absence of Filter of Nozzle | Ratio of Change in Luminance |
|---|---|---|---|
| Comparative Example 7 | (passing of 10 to 20 minutes after filtration) | nozzle without filter | 0 (standard) |
| Example 16 | passing of 12 hours after filtration | nozzle without filter | 8.2 |
| Example 19 | passing of 24 hours after filtration | nozzle without filter | 9.7 |
| Example 22 | passing of 48 hours after filtration | nozzle without filter | 8.6 |
| Example 25 | passing of 7 days after filtration | nozzle without filter | 7.4 |
| Comparative Example 13 | passing of 7 days after filtration (+passing of 10 to 20 minutes after re-filtration) | nozzle without filter | 3.6 |
| Comparative Example 10 | (passing of 10 to 20 minutes after filtration) | nozzle with filter | 0 (standard) |
| Example 28 | passing of 12 hours after filtration | nozzle with filter | 9.0 |
| Example 31 | passing of 24 hours after filtration | nozzle with filter | 8.7 |
| Example 34 | passing of 48 hours after filtration | nozzle with filter | 8.3 |
| Example 37 | passing of 7 days after filtration | nozzle with filter | 6.2 |
| Comparative Example 16 | passing of 7 days after filtration (+passing of 10 to 20 minutes after re-filtration) | nozzle with filter | −2.2 |

*EML host: C1 and C2, EML dopant: C6 and C7.

TABLE 5

|  | Filtration and Time-Elapsing Steps | Presence or Absence of Filter of Nozzle | Ratio of Change in Luminance |
|---|---|---|---|
| Comparative Example 8 | (passing of 10 to 20 minutes after filtration) | nozzle without filter | 0 (standard) |
| Example 17 | passing of 12 hours after filtration | nozzle without filter | 5.7 |
| Example 20 | passing of 24 hours after filtration | nozzle without filter | 6.6 |
| Example 23 | passing of 48 hours after filtration | nozzle without filter | 7.3 |
| Example 26 | passing of 7 days after filtration | nozzle without filter | 6.4 |
| Comparative Example 14 | passing of 7 days after filtration (+passing of 10 to 20 minutes after re-filtration) | nozzle without filter | 3.8 |
| Comparative Example 11 | (passing of 10 to 20 minutes after filtration) | nozzle with filter | 0 (standard) |
| Example 29 | passing of 12 hours after filtration | nozzle with filter | 3.5 |
| Example 32 | passing of 24 hours after filtration | nozzle with filter | 5.5 |
| Example 35 | passing of 48 hours after filtration | nozzle with filter | 4.8 |
| Example 38 | passing of 7 days after filtration | nozzle with filter | 3.8 |
| Comparative Example 17 | passing of 7 days after filtration (+passing of 10 to 20 minutes after re-filtration) | nozzle with filter | −2.3 |

*EML host: C3 and C4, EML dopant: C6.

TABLE 6

|  | Filtration and Time-Elapsing Steps | Presence or Absence of Filter of Nozzle | Ratio of Change in Luminance |
|---|---|---|---|
| Comparative Example 9 | (passing of 10 to 20 minutes after filtration) | nozzle without filter | 0 (standard) |
| Example 18 | passing of 12 hours after filtration | nozzle without filter | 14.0 |
| Example 21 | passing of 24 hours after filtration | nozzle without filter | 1.5 |
| Example 24 | passing of 48 hours after filtration | nozzle without filter | 3.7 |
| Example 27 | passing of 7 days after filtration | nozzle without filter | 12.3 |
| Comparative Example 15 | passing of 7 days after filtration (+passing of 10 to 20 minutes after re-filtration) | nozzle without filter | −25.3 |
| Comparative Example 12 | (passing of 10 to 20 minutes after filtration) | nozzle with filter | 0 (standard) |
| Example 30 | passing of 12 hours after filtration | nozzle with filter | 16.0 |
| Example 33 | passing of 24 hours after filtration | nozzle with filter | 8.3 |
| Example 36 | passing of 48 hours after filtration | nozzle with filter | 1.7 |
| Example 39 | passing of 7 days after filtration | nozzle with filter | 17.7 |
| Comparative Example 18 | passing of 7 days after filtration (+passing of 10 to 20 minutes after re-filtration) | nozzle with filter | −7.5 |

*EML host: C5, EML dopant: C8.

As shown in Tables 1 to 6, it is seen that the organic electroluminescence element of the present invention has a high current efficiency and a long drive life.

While the invention has been described in detail and with reference to specific embodiments thereof, it will be apparent to one skilled in the art that various changes and modifications can be made therein without departing from the spirit and scope of the invention. This application is based on Japanese Patent Application (Patent Application No. 2010-090459) filed on Apr. 9, 2010, the entirety of which is incorporated herein by way of reference.

DESCRIPTION OF REFERENCE NUMERALS AND SIGNS

| 1 | Substrate |
| 2 | Anode |
| 3 | Hole injection layer |
| 4 | Hole transport layer |
| 5 | Luminescent layer |
| 6 | Hole blocking layer |
| 7 | Electron transport layer |
| 8 | Electron injection layer |
| 9 | Cathode |
| 10 | Organic electroluminescence element |

The invention claimed is:

1. A process of producing an organic electroluminescence element composition, comprising a filtration step of filtering a solution containing an organic electroluminescence element material and a solvent, wherein the composition is obtained after a time-elapsing step wherein 8 hours or more elapses after the filtration step, and the composition is used for a wet film formation of an organic layer in an organic electroluminescence element.

2. The process of producing an organic electroluminescence element composition as claimed in claim 1, wherein the molecular weight of the organic electroluminescence element material is from 100 to 10,000.

3. The process of producing an organic electroluminescence element composition as claimed in claim 1, wherein the organic electroluminescence element material is a luminescent layer material.

4. An organic electroluminescence element composition, produced by the process of producing an organic electroluminescence element composition claimed in claim 1.

5. A process of producing an organic electroluminescence element comprising an organic layer between an anode and a cathode, wherein the organic layer is formed by a wet film formation of the organic electroluminescence element composition claimed in claim 4.

6. A process of producing an organic electroluminescence element comprising an organic layer between an anode and a cathode, wherein the organic layer is formed by a wet film formation of a composition that is obtained after a solution containing an organic electroluminescence element material and a solvent is filtered and then 8 hours or more elapses.

7. An organic electroluminescence element obtained by the process of producing an organic electroluminescence element claimed in claim 6.

8. An organic EL display device comprising the organic electroluminescence element claimed in claim 7.

9. An organic EL lighting comprising the organic electroluminescence element claimed in claim 7.

10. An organic electroluminescence element composition, produced by the process of producing an organic electroluminescence element composition claimed in claim 2.

11. An organic electroluminescence element obtained by the process of producing an organic electroluminescence element claimed in claim 5.

* * * * *